US006831116B2

(12) United States Patent
Bitler et al.

(10) Patent No.: US 6,831,116 B2
(45) Date of Patent: Dec. 14, 2004

(54) POLYMERIC MODIFYING AGENTS

(75) Inventors: Steven P. Bitler, Menlo Park, CA (US); Ray F. Stewart, Redwood City, CA (US); Mark A. Wanthal, Redwood Shores, CA (US); David A. Kamp, Sunnyvale, CA (US); Paul A. Meyers, San Ramon, CA (US); David D. Taft, Atherton, CA (US); Donald A. Schultz, San Mateo, CA (US)

(73) Assignee: Landec Corporation, Menlo Park, CA (US)

( * ) Notice: Subject to any disclaimer, the term of this patent is extended or adjusted under 35 U.S.C. 154(b) by 545 days.

(21) Appl. No.: 09/733,744

(22) Filed: Dec. 8, 2000

(65) Prior Publication Data

US 2001/0007881 A1 Jul. 12, 2001

Related U.S. Application Data

(62) Division of application No. 09/216,520, filed on Dec. 16, 1998, now Pat. No. 6,255,367, which is a continuation-in-part of application No. 08/726,739, filed on Oct. 15, 1996, now abandoned, which is a continuation-in-part of application No. 08/726,741, filed on Oct. 15, 1996, now abandoned, which is a continuation-in-part of application No. 08/726,740, filed on Oct. 15, 1996, now abandoned, which is a continuation of application No. 08/710,161, filed on Sep. 12, 1996, now abandoned, which is a continuation of application No. 08/448,688, filed on May 24, 1995, now abandoned, which is a continuation of application No. 08/448,685, filed on May 24, 1995, now abandoned, which is a continuation of application No. 08/399,724, filed on Mar. 7, 1995, now abandoned.

(51) Int. Cl.[7] .............................. C08K 9/10; C08F 8/00; C08L 51/00; C08L 63/00; C08L 67/00
(52) U.S. Cl. ........................ 523/210; 523/211; 523/400; 523/440; 523/513; 525/64; 525/107; 525/123; 525/362; 525/374; 525/376; 525/387
(58) Field of Search ................................. 523/210, 211, 523/402, 440, 513; 525/64, 107, 123, 362, 374, 376, 387

(56) References Cited

U.S. PATENT DOCUMENTS

| | | | |
|---|---|---|---|
| 3,616,229 A | 10/1971 | Wildi et al. ................... 195/63 |
| 3,933,940 A | 1/1976 | Anderson et al. ............. 525/43 |
| 4,070,348 A | 1/1978 | Kraemer et al. ..... 260/79.3 MU |
| 4,093,675 A | 6/1978 | Schare et al. ................ 525/438 |
| 4,208,309 A | 6/1980 | Kraemer et al. ............... 260/8 |
| 4,339,571 A | 7/1982 | Gutekunst et al. ......... 5258/361 |
| 4,349,651 A | 9/1982 | Smith ......................... 526/263 |
| 4,358,571 A | 11/1982 | Kaufman et al. ............ 525/524 |
| 4,405,757 A | 9/1983 | Howell et al. ............. 525/326.9 |
| 4,410,660 A | 10/1983 | Straus ....................... 525/54.1 |
| 4,420,605 A | 12/1983 | Kaufman .................... 528/94 |
| 4,421,897 A | 12/1983 | Gutekunst et al. .......... 525/119 |
| 4,430,445 A | 2/1984 | Miyake et al. ................ 521/38 |
| 4,468,499 A | 8/1984 | Sieghried et al. ............ 525/93 |
| 4,542,202 A | 9/1985 | Takeuchi et al. ............... 525/96 |
| 4,546,155 A | 10/1985 | Hirose et al. ................ 525/504 |
| 4,659,779 A | 4/1987 | Bagga et al. ................ 428/118 |
| 4,689,388 A | 8/1987 | Hirai et al. .................. 528/104 |
| 4,701,378 A | 10/1987 | Bagga et al. ................ 425/414 |
| 4,707,521 A | 11/1987 | Esneault et al. ............. 525/250 |
| 4,739,013 A | 4/1988 | Pinchuk et al. ............. 525/102 |
| 4,742,148 A | 5/1988 | Lee et al. .................... 526/117 |
| 4,752,638 A | 6/1988 | Nowinski et al. ........... 525/54.1 |
| 4,775,718 A | 10/1988 | Broekhuis et al. ............. 525/44 |
| 4,830,855 A | 5/1989 | Stewart ....................... 424/448 |
| 4,830,863 A | 5/1989 | Jones ......................... 426/118 |
| 4,851,474 A | 7/1989 | Willis et al. ............... 525/92 F |
| 4,877,679 A | 10/1989 | Leatherman ................. 428/224 |
| 4,910,258 A | * 3/1990 | Inoue et al. |
| 4,921,913 A | 5/1990 | Pettit, Jr. ..................... 525/119 |
| 4,933,392 A | 6/1990 | Andrews et al. ............. 525/110 |
| 4,954,472 A | 9/1990 | Scott et al. .................. 502/152 |
| 4,954,592 A | 9/1990 | Kaschig ...................... 526/265 |
| 5,021,510 A | 6/1991 | Vroomans ................... 525/285 |
| 5,034,428 A | 7/1991 | Hoffman et al. ............... 522/5 |

(List continued on next page.)

FOREIGN PATENT DOCUMENTS

| | | | | |
|---|---|---|---|---|
| DE | 1 669 262 A | 5/1971 | | |
| EP | A-0018950 | 11/1980 | | |
| EP | 0074218 A1 | 3/1983 | | |
| EP | 0223045 A2 | 5/1987 | | |
| EP | 0286734 | 10/1988 | ......... | C08F/255/02 |
| EP | A-0362787 | 11/1990 | | |
| GB | 1 104 274 | 10/1996 | | |
| JP | 05230112 | 3/1995 | | |
| JP | 7086465 A | 3/1995 | | |
| LU | 57 906 A | 8/1970 | | |
| WO | WO 93/07194 | 4/1993 | | |
| WO | WO-A-93/21967 | 11/1993 | | |
| WO | WO 94/12040 | 9/1994 | | |
| WO | WO 94/24219 | 10/1994 | | |
| WO | WO 96 27641 A | 9/1996 | | |

OTHER PUBLICATIONS

Progress in Rubber and Plastics Technology, vol. 4, No. 1 (1988), pp. 19–30.
Woods, The ICI Polyurethanes Books, John Wiley & Sons, 1987.

(List continued on next page.)

*Primary Examiner*—Tae H. Yoon
(74) *Attorney, Agent, or Firm*—Jeffrey G. Sheldon; Sheldon & Mak

(57) ABSTRACT

Novel modifying agents contain a sharply-melting crystalline polymer ingredient, preferably a side chain crystalline (SCC) ingredient, and an active chemical ingredient. Such modifying agents, especially when in the form of particles, can be placed in contact with a matrix, will not modify the matrix below the crystalline melting point $T_p$, but will rapidly modify the matrix above $T_p$. The active chemical ingredient can react with the matrix, catalyze a reaction of the matrix, or inhibit a reaction of the matrix. Particularly useful compositions are polymer precursors which are storage-stable at low temperatures but which are rapidly converted to crosslinked resins when heated to temperatures above $T_p$, optionally in the presence of light.

107 Claims, No Drawings

U.S. PATENT DOCUMENTS

| | | | |
|---|---|---|---|
| 5,059,654 A | 10/1991 | Hou et al. ................. | 525/54.1 |
| 5,091,471 A | 2/1992 | Graves et al. ............... | 525/90 |
| 5,129,180 A | 7/1992 | Stewart ...................... | 47/57.6 |
| 5,130,380 A | 7/1992 | Carew ........................ | 525/343 |
| 5,144,008 A | 9/1992 | Ikeda et al. ................. | 530/354 |
| 5,156,911 A | 10/1992 | Stewart ...................... | 428/355 |
| 5,160,768 A | 11/1992 | Antoon, Jr. .................. | 428/35 |
| 5,194,499 A | 3/1993 | Hergenrother et al. ........ | 525/91 |
| 5,231,156 A | 7/1993 | Lin ........................... | 526/279 |
| 5,241,036 A * | 8/1993 | Hsiue et al. | |
| 5,252,695 A | 10/1993 | Niciri et al. ................. | 528/30 |
| 5,292,811 A | 3/1994 | Murata et al. .............. | 525/193 |
| 5,292,830 A | 3/1994 | Funatayama et al. ....... | 525/478 |
| 5,310,786 A | 5/1994 | Vorlop et al. .............. | 525/54.1 |
| 5,342,858 A | 8/1994 | Litchholt et al. ............ | 521/96 |
| 5,362,812 A | 11/1994 | Holmes et al. ............. | 525/274 |
| 5,368,048 A | 11/1994 | Stoy et al. .................. | 128/772 |
| 5,387,450 A | 2/1995 | Stewart ...................... | 428/40 |
| 5,397,822 A | 3/1995 | Lee, Jr. ...................... | 524/127 |
| 5,412,035 A | 5/1995 | Schmitt et al. ............. | 525/228 |
| 5,414,058 A | 5/1995 | Ono et al. .................. | 525/523 |
| 5,430,112 A | 7/1995 | Sakata et al. ............... | 525/526 |
| 5,439,977 A | 8/1995 | Yokota et al. .............. | 525/113 |
| 5,491,184 A | 2/1996 | Mc Bain et al. ............ | 525/43 |
| 5,523,337 A | 6/1996 | Banerjee et al. .......... | 525/92 F |
| 5,639,825 A | 6/1997 | Nanbu et al. ............... | 525/100 |
| 5,665,822 A | 9/1997 | Bitler et al. ................. | 525/92 |
| 5,783,302 A | 7/1998 | Bitler et al. ................ | 428/343 |
| 6,492,462 B2 * | 12/2002 | Bitler et al. | |

OTHER PUBLICATIONS

Hartshorn, Structural Adhesives, Chemistry and Technology, Marcel Dekker Inc., 1988.

May, Epoxy Resins, Chemistry and Technology, 2nd Ed., Marcel Dekker, Inc., 1988.

Lee and Neville, Handbook of Epoxy Resins, McGraw–Hill Book Company 1967.

Ellia, Chemistry and Technology of Epoxy Resins, Blackie Academic & Professional, 1993.

The Society of the Plastics Industry, Inc., Test Methods for Epoxy Compounds.

Tun, Thermal Characterization of Polymeric Materials, Academic Press, Inc., 1981.

Gates, Catalysts, Polymer–Supported, Encyclopedia of Polymer Science & Eng., vol. 2, pp. 708–729.

Takaishi, et al., *Transition Metal Catalyzed Asymmetric Organic Syntheses via Polymer–Attached Optically Active Phosphine Ligands. Synthesis of R Amino Acids and Hyrdatropic Acid by Hydrogenation*, Journal of the American Chemical Society, 100;1, Jan. 4, 1978, pp. 264–272.

Chevron Olefins and Derivatives Division, et al., Gulftene Alpha Olefins, pp. 3, 5, 7, 11, 13, 32.

"Polyurethanes, Chemistry, Technology and Applications" by Z. Wirpaza, pp. 142–143, 299–301, 310–312 and 316.

"Reaction Polymers" by Wilson F. Gum, pp. 151–152, 165–169, 247–251.

* cited by examiner

POLYMERIC MODIFYING AGENTS

CROSS-REFERENCE TO RELATED APPLICATIONS

This application is a divisional of copending, commonly assigned application Ser. No. 09/216,520, filed Dec. 16, 1998, by Bitler, Stewart, Wanthal, Kamp, Meyers, Taft and Schultz, now U.S. Pat. No. 6,255,367. Ser. No. 09/216,520 is a continuation of application Ser. No. 08/710,161, filed Sep. 12, 1996, now abandoned, and a continuation-in-part of (1) Application Ser. No. 08/726,739, filed Oct. 15, 1996, by Bitler and Stewart, now abandoned, which is a file wrapper continuation of application Ser. No. 08/399,724, filed Mar. 7, 1995, now abandoned;

(2) Application Ser. No. 08/726,741, filed Oct. 15, 1996, by Bitler and Stewart, now abandoned, which is a continuation of application Ser. No. 08/448,688, filed May 24, 1995, now abandoned, which is also a continuation of application Ser. No. 08/399,724, filed Mar. 7, 1995, now abandoned; and continuation-in-part (3) Application Ser. No. 8/726,740, filed Oct. 15, 1996, by Bitler and Stewart, now abandoned, which is a file wrapper continuation of application Ser. No. 08/448,685, filed May 24, 1995, now abandoned, which is also a continuation of application Ser. No. 08/399,724, filed Mar. 7, 1995, now abandoned by Steven P. Bitler and Ray F. Stewart.

This application also claims priority under 35 USC 119 and 365(a) from International Patent Application No. PCT/US96/03023 filed Mar. 6, 1996. The entire disclosure of each of the applications listed above is incorporated herein by reference.

BACKGROUND OF THE INVENTION

1. Field of the Invention

This invention relates to polymeric modifying agents having temperature-dependent properties.

2. Introduction to the Invention

It is known to control the rate of a chemical reaction by providing a reactant, a catalyst or other active agent in a modified form such that the availability of the active agent depends upon some external factor. For example, the active agent can be encapsulated by a protective shell which at least partly prevents access to the active agent. When release of the active agent or an increase in its concentration is desired, the shell is removed, or the shell is subjected to a treatment which does not destroy its physical integrity (i.e. the shell retains its shape and is not free to flow during the treatment), but which increases the rate at which the active agent can permeate through the shell. Removal of the shell can be effected, for example, by means of heat, solvent, or ultrasonic waves. A change in the permeation rate can, for example, be effected by using a shell having temperature-dependent permeability and by changing the ambient temperature; for further details of particularly useful temperature-dependent systems of this kind, reference may be made, for example, to commonly assigned U.S. Pat. No. 4,830,855 (Stewart), U.S. Pat. No. 5,129,180 (Stewart) and U.S. Pat. No. 5,254,354 (Stewart), the disclosures of which are incorporated herein by reference for all purposes.

It is also known to use so-called "latent hardeners" or "latent curing agents", optionally in conjunction with "latent accelerators". These "latent" compounds can be mixed with the other ingredients for a crosslinked resin, e.g. an epoxy resin or a polyurethane, to give compositions which are relatively stable at room temperature but which cure rapidly when heated to an elevated temperature, e.g. 160° C. or more. Systems of this kind are disclosed for example in U.S. Pat. No. 4,349,651 (Smith), U.S. Pat. No. 4,358,571 (Kaufman et al), U.S. Pat. No. 4,420,605 (Kaufman), U.S. Pat. No. 4,430,445 (Miyake), U.S. Pat. No. 4,659,779 (Bagga et al), U.S. Pat. No. 4,689,388 (Hirai et al), U.S. Pat. No. 4,701,378 (Bagga et al), U.S. Pat. No. 4,742,148 (Lee et al) and U.S. Pat. No. 4,933,392 (Andrews et al), and European Patent Publication No. 362787 A2 (Henkel), the disclosures of which are incorporated herein for all purposes.

Many attempts have been made to develop systems which are stable for extended periods at storage temperatures, but which will cure rapidly when heated to give crosslinked polymers having desired properties. However, only limited success has been achieved.

It is also known to prepare polymers containing reactive moieties which will react with other materials under appropriate conditions. For example, in the materials often referred to as "polymer-supported catalysts", the reactive moiety is one which provides a catalytic function. Reference may be made, for example, to Encyclopedia of Polymer Science and Engineering, Vol 2, pages 702–729, the disclosure of which is incorporated herein by reference for all purposes.

SUMMARY OF THE INVENTION

We have now discovered, in accordance with this invention, that greatly improved results can be achieved through the use of polymeric materials which comprise (i) a crystalline polymeric ingredient which melts and flows over a relatively small temperature range and (ii) an active chemical ingredient which promotes or inhibits a chemical reaction of a matrix. Such materials are referred to herein as "modifying agents". We have found that when such a modifying agent, in solid form, is in contact with the matrix (e.g. as solid particles dispersed in the matrix), the polymeric ingredient restricts the contact between the matrix and the active chemical ingredient. On the other hand, when the modifying agent is heated to the melting point of the crystalline polymeric ingredient, the modifying agent melts and flows, and as a result there is a rapid increase in the extent to which the matrix is contacted by the active chemical ingredient. A similar increase can also be achieved by other treatments, either alone or in conjunction with heating (either simultaneously or sequentially), which cause the modifying agent to lose its physical integrity, so that the polymeric ingredient and the active chemical ingredient are free to disperse into the matrix, preferably so that they become substantially uniformly distributed thereon. Such other treatments include for example, one or more of (a) addition of a solvent, (b) exposure to electromagnetic radiation, including visible and ultraviolet light, or to ultrasonic radiation, or (c) increasing or decreasing the pH. In some cases there is a chemical bond between the polymeric and active chemical ingredients; in other cases, the active chemical ingredient is merely associated with, preferably dispersed in, the polymeric ingredient.

The active chemical ingredient is one which promotes or inhibits a chemical reaction of the matrix under selected conditions. The selected conditions can result directly from the treatment which increases the availability of the active chemical ingredient, or they can involve some further change (e.g. a change in temperature, pressure, pH or radiation, or the addition of a solvent or a reactant) that does not substantially reduce the extent to which the matrix is contacted by the active chemical ingredient. The active chemical ingredient can be (1) a catalytic ingredient (i.e. an ingredient which (a) reacts chemically with an ingredient of the matrix and is thereafter regenerated or converted into another compound, or (b) reacts chemically with a material which is adjacent to or absorbed into the matrix and is thereafter regenerated or converted into another compound, and in either case does not form a permanent chemical bond with an ingredient of the matrix); or (2) a reactive ingredient (i.e. one which reacts chemically, and forms a permanent chemical bond, with an ingredient of the matrix, and is not regenerated); or (3) an inhibiting ingredient (i.e. one which reduces the rate of a chemical reaction of the matrix, optionally by itself reacting preferentially with a material, e.g. oxygen, which would otherwise react with the matrix).

In particularly preferred embodiments of the invention, the crystalline polymeric ingredient is a side chain crystallizable (SCC) polymer. SCC polymers generally contain side chains comprising substituted or unsubstituted n-alkyl groups of 6 to 50, usually 12 to 50, carbon atoms, derived, for example, from one or more n-alkyl acrylates or methacrylates. The melting point of an SCC polymer is in large measure controlled by the number of carbon atoms in the n-alkyl group or groups and is not (as in most other polymers) heavily dependent on the molecular weight of the polymer or on the presence of other comonomer units (e.g. derived from acrylic acid, acrylonitrile or an unsubstituted or substituted lower alkyl acrylate). Furthermore, SCC polymers generally melt over a small temperature range, e.g. less than 10° C. As a result, it is possible to select an SCC polymer which will cause the modifying agent to melt over a narrow and predetermined range, thus making a sharp change in the extent to which the active chemical ingredient contacts the matrix.

As explained in detail below, a number of different factors influence the extent and the speed of the change in the extent to which the active chemical ingredient contacts the matrix. These factors include (1) the form of the modifying agent (in particular the size of the particles thereof, when, as is preferred, the modifying agent is in the form of particles dispersed in the matrix), (2) whether or not there is a chemical bond between the polymeric ingredient and the active chemical ingredient, and if there is a chemical bond, the nature and the strength of the bond between the polymeric moiety and the active chemical moiety (which may be a covalent, ionic, mixed covalent-ionic, or ligand-attached bond, preferably a covalent bond), (3) the crystallinity of the crystalline ingredient and the temperature range over which it melts (which is preferably less than 10° C. between onset of melting and peak on a DSC curve), (4) the extent and rapidity of the temperature change or other treatment which is carried out in order to promote (or inhibit) the chemical reaction of the matrix, (5) the presence of coadditives, and (6) the presence of enhancing groups on one or both of the matrix and the modifying agent. Preferably, the combination of these factors results in an increase in the effective concentration of the chemical moiety by a factor of at least 500, particularly at least 1000, especially at least 2,000, with substantially greater increases, e.g. at least 3,000, being obtainable in many cases.

The surface of the solid particles or film of the modifying agent will normally be directly contacted by the matrix material. However, the invention includes the possibility that the modifying agent will be at least partly encapsulated by a material which can be removed before or after the modifying agent is activated, e.g. a polymeric coating having a melting point below $T_o$.

The temperature-sensitive modifying agent used in the present invention (a) comprises
   (i) a polymeric ingredient which comprises a crystalline polymeric moiety having an onset of melting temperature $T_o$ and a peak melting temperature $T_p$ such that $T_p-T_o$ is less than $T_p^{0.7}$, preferably less than $T_p^{0.6}$, and
   (ii) an active chemical ingredient which, when in contact with a matrix material under selected conditions, promotes or inhibits a chemical reaction of the matrix material, and (b) is in the form of a solid which, when exposed to a change in a variable selected from temperature, concentration of a solvent, electromagnetic radiation, ultrasonic radiation, and pH, undergoes a physical change which causes the modifying agent to lose its physical integrity and increases the extent to which the matrix material is contacted by the active chemical ingredient.

In a first preferred aspect, this invention provides a composition which comprises (1) a matrix material; and
(2) distributed in the matrix material, or adjacent to the matrix material, a modifying agent as defined above which undergoes a said physical change when it is subjected, while it is in contact with the matrix material, to a said change in a variable, and which is preferably in the form of
   (i) solid particles which are distributed in the matrix material, and which have one or more of the following characteristics
      (a) an average particle size of 0.1 to 150 microns,
      (b) a polymeric ingredient having a heat of fusion of at least 20 J/g, and
      (c) a polymeric ingredient in which the crystalline polymeric moiety is a side chain crystalline polymer, or
   (ii) a film which is in contact with the matrix material.

In a second preferred aspect, the invention provides a method of making a chemical compound, especially a polymer, which comprises (A) subjecting a composition according to the first preferred aspect of the invention to a said change in a variable; and
(B) simultaneously with step (A), or after step (A), subjecting the matrix material and the modifying agent in contact therewith to conditions which cause a chemical reaction of the matrix material.

Many of the chemical compounds and products which can be prepared by the second preferred aspect of the invention are themselves novel. Thus, many of the compounds which result when the modifying agent reacts with the matrix material are novel when there is a chemical bond between the polymeric and active ingredients. Other products which can be prepared in accordance with the present invention, although known as chemical compounds in some products, are not known as other useful products, e.g. as foams, which are easily prepared by this invention. These novel compounds and products are part of the present invention. For example, in a third preferred aspect, this invention provides a copolymer which comprises (A) first polymeric blocks which comprise a polymeric moiety comprising a crystalline polymeric moiety having an onset of melting temperature $T_o$ and a peak melting temperature $T_p$ such that $T_p-T_o$ is less than $T_p^{0.7}$, and (B) second polymeric blocks which are different from the first polymeric blocks, the copolymer having at least one of the following characteristics (1) the first polymeric blocks are derived from a novel modifying agent as defined below as the fifth preferred aspect of the invention;

(2) the crystalline polymeric moiety in the first polymeric blocks has a heat of fusion of at least 20 J/g and/or is a side chain crystalline polymeric moiety, and the copolymer is in the form of a foam, an electrically insulating coating on a conductor, a coating on a printed circuit board, a resist on a substrate which is to be plated or etched, an epoxy graphite composite, or a powder coating; and (3) the crystalline polymeric moiety in the first polymeric blocks has a heat of fusion of at least 20 J/g and/or is a side chain crystalline polymeric moiety, and the polymer is crosslinked, preferably thermoset so that it does not flow when heated; and In another example, in a fourth preferred aspect, this invention provides a product which comprises (A) a first polymer which is a side chain crystalline polymer having an onset of melting temperature $T_o$ and a peak melting temperature $T_p$ such that $T_p-T_o$ is less than $T_p^{0.7}$, preferably less than $T_p^{0.6}$, and (B) a second polymer which is different from the first polymer, which is thermoset so that it does not flow when heated, and which provides a continuous phase in which the first polymer is distributed.

The compositions and methods of the first and second preferred aspects of the invention offer a number of important advantages over known compositions. Especially when the polymeric and active chemical ingredients of the modifier are chemically bonded to each other, particularly through a covalent bond having a bond strength of at least 10 Kcal/mole, the compositions can have improved storage stability such that they can be stored in larger containers and used partially and from time to time; that they may not need to be sealed against the ingress of moisture, etc.; that they may not need to be transported and stored under cooled conditions; and that they can be pumped from a storage area to a manufacturing area. Even when there is no chemical bond, or only a weak chemical bond, between the polymeric and active chemical ingredients of the modifier, and as a result the increase in stability is relatively small, this can be very valuable, for example in reaction injection molding (RIM) processes. The compositions can also contain other ingredients, for example additives which reduce the viscosity of the composition, surface active agents, including wetting agents, compatibilizers, and melt flow promoting agents.

Some of the temperature-sensitive modifying agents used in this invention are novel compounds and as such are part of the present invention. Furthermore, many of the temperature-sensitive modifying agents, even though known as chemical compounds for other purposes, are novel in forms, e.g. particles or thin films, which are particularly suitable for use in this invention, and in such forms are part of the present invention. For example, a fifth preferred aspect of this invention provides a temperature-sensitive modifying agent as defined above which has one or both of the following characteristics (1) the active chemical ingredient is chemically bonded to the polymeric ingredient and is a catalytic moiety comprising a metal or an enzyme, and (2) the crystalline polymeric ingredient has a heat of fusion of at least 20 J/g and/or is a side chain crystalline polymeric moiety, and the modifying agent is in the form of particles having an average diameter of 0.1 to 150, particularly 0.1 to 50, microns.

In a sixth preferred aspect, this invention provides a method of making a temperature-sensitive modifying agent which comprises (i) a polymeric moiety which comprises a crystalline polymeric moiety having an onset of melting temperature $T_o$ and a peak melting temperature $T_p$ such that $T_p-T_o$ is less than $T_p^{0.7}$; and (ii) a catalytic moiety which is bonded to the polymeric moiety through a bond having a strength of at least 10 Kcal/mole;

said method comprising (I) copolymerizing (a) a first monomeric component which comprises one or more monomers which can be polymerized to form a crystalline polymeric moiety having an onset of melting temperature $T_o$ and a peak melting temperature $T_p$ such that $T_p-T_o$ is less than $T_p^{0.7}$, and (b) a second monomeric component which can be copolymerized with the first component and which comprises one or more monomers containing an active chemical moiety which (i) does not react during the copolymerization and (ii) contains a metal or an enzyme and can catalyze a reaction of a matrix;

(II)

(A) providing a polymer which comprises (i) a crystalline polymeric moiety having an onset of melting temperature $T_o$ and a peak melting temperature $T_p$ such that $T_p-T_o$ is less than $T_p^{0.7}$, and (ii) at least one reactive group P; and (B) reacting the polymer provided in step (A) with a component which contains at least one reactive group T which will react with the group P and at least one active chemical moiety which (i) does not react during the reaction and (ii) contains a metal or an enzyme and can catalyze a reaction of a matrix; or (III)

(A) providing a polymer which contains at least one reactive group Q and a plurality of catalytic moieties which contain a metal or an enzyme and can catalyze a reaction of a matrix, and (B) reacting the polymer provided in step A with a component which (i) contains at least one reactive group V which will react with the group Q and (ii) after the reaction, provides a crystalline polymeric moiety having an onset of melting temperature $T_o$ and a peak melting temperature $T_p$ such that $T_p-T_o$ is less than $T_p^{0.7}$; or (IV)

(A) providing a polymer which contains a plurality of reactive groups R, which may be the same or different, and (B) reacting the polymer provided in step A with a first component which (1) contains at least one reactive group W which will react with the group R and (ii) after the reaction, provides a crystalline polymeric moiety having an onset of melting temperature $T_o$ and a peak melting temperature $T_p$ such that $T_p-T_o$ is less than $T_p^{0.7}$, and with a second component which contains at least one reactive group X which will react with the group R and at least one active chemical moiety which (i) does not react during the reaction and (ii) contain a metal or an enzyme and can catalyze a reaction of a matrix.

In a seventh preferred aspect, this invention provides a method of making a temperature-sensitive modifying agent as defined above in which the polymeric ingredient has a heat of fusion of at least 20 J/g and/or contains a side chain crystalline polymeric moiety, which method comprises forming the modifying agent into particles having an average diameter of 0.1 to 150 microns, e.g. by milling the solid modifying agent, or by spray drying or otherwise forming into particles (a) a solution of the modifying agent or (b) the molten modifying agent; or, in a different procedure which results in particles of the active ingredient coated by the polymeric ingredient, (A) forming the active chemical ingredient into particles having an average diameter of 0.1 to 150 microns, and (B) forming the polymeric ingredient into a coating around the particles prepared in step (A).

In one such method, the molten modifying agent can be mixed with a suitable heated matrix and then cooled so that the modifying agent solidifies in the form of particles dispersed in the matrix.

DETAILED DESCRIPTION OF THE INVENTION

In this specification, parts and percentages are by weight, temperatures are in ° C., and $T_o$, $T_p$ and heat of fusion are determined using a differential scanning calorimeter (DSC) at a rate of temperature change of 10° C./min. $T_o$ and $T_p$ are measured in the conventional way well known to those skilled in the art. Thus $T_p$ is the temperature at the peak of the DSC curve, and $T_o$ is the temperature at the intersection of the baseline of the DSC peak and the onset line, the onset line being defined as the tangent to the steepest part of the DSC curve below $T_p$. The abbreviation CxA is used to denote an n-alkyl acrylate in which the n-alkyl group contains x carbon atoms, the abbreviation Cx alkyl is used herein to denote an n-alkyl group which contains x carbon atoms, and the abbreviation Cx IEMA is used to denote n-alkyl oxyycarbonylamidoethyl methacrylates in which the n-alkyl group contains x carbon atoms.

Matrix Materials

The terms "matrix" and "matrix material" are used in this specification to denote any material or mixture of materials with which the modifying agent is contacted. The matrix often comprises at least one solid or liquid material which provides a continuous phase in which the modifying agent is distributed. Such a matrix can include, in addition to the modifying agent, one or more other materials which are distributed in the continuous phase of the matrix, for example dissolved or dispersed in the form of particles in the continuous phase. Some such other materials are described in the sections below entitled Coreactants and Coadditives. Alternatively, for example, the matrix can be in the form of particles, e.g. a fine powder, which is blended with particles of the modifying agent, or in the form of a liquid or gas or solid which is contacted with the modifying agent, for example with one or both surfaces of a film of the modifying agent (the term "film" is used herein to include a layer of the modifying agent which is supported on a substrate). A matrix in the form of particles may melt at a temperature above or below the melting point of the modifying agent.

The invention is particularly useful for matrix materials which, alone or in combination with other ingredients, are polymerized and/or crosslinked when they are exposed to the active chemical moiety in the modifying agent. These matrix materials include for example cyanoacrylates, epoxy resins, epoxy novolacs, unsaturated poly-esters, including vinyl esters, and precursors for polyurethanes, polyureas, polyisocyanurates, polyacrylics and polyphenolics. The term "unsaturated polyester" is used in this specification in its conventional sense to mean a polymer in which the monomer units are linked to each other through an ester group and which contains carbon-carbon double bonds that are capable of undergoing further polymerization. The term "vinyl ester" is likewise used in its conventional sense to denote a subclass of the unsaturated polyesters, namely those which contain vinyl groups, in particular polymers made by addition reactions involving epoxides and acids. In order to prepare crosslinked thermoset resins from these polymers, they are generally dissolved in a monomer such as styrene and then copolymerized with the monomer. Compositions comprising such polymerizable materials are well known and are disclosed for example in:

(a) Handbook of Epoxy Resins by Henry Lee and Kris Neville; 1967; McGraw-Hill Inc.

(b) Epoxy Resins, Chemistry and Technology 2nd Edition, edited by Clayton A. May; 1988; Marcel Dekker, Inc.

(c) Polyurethanes, Chemistry, Technology and Applications by Z. Wirpsza; 1993; Ellis Norwood Ltd.

(d) The ICI Polyurethanes Book by George Woods; 1987; John Wiley & Sons, Inc.

(e) Structural Adhesives, Chemistry and Technology, edited by S. R. Hartshort; 1986; Plenum Press (f) Test Methods for Epoxy Compounds; published by the Society of the Plastics Industry, Inc., Epoxy Resin Formlations Division (g) Thermal Characterization of Polymeric Materials, edited by Edith A. Turi; 1981; Academic Press, Inc., and (h) Reaction Polymers, edited by Wilson F. Gum et al, Hanser Publishing, the disclosures of which are incorporated herein by reference. A specific example of such a material is the epoxy resin available from Shell Corp. under the trade name Epon 828. Where these known compositions contain hardeners (or curing agents) and/or accelerators (including latent hardeners and/or latent accelerators) and/or toughening agents and/or other ingredients which provide desired properties in the end products, the modifying agents can be used in addition to, or to replace all or part of, such ingredients. Thus the modifying agent may be used to enhance the properties of other components in the matrix. For example, in an epoxy matrix containing dicyandiamide (DICY) or an anhydride, the modifying agent may cause the composition to cure at a lower temperature and/or at a faster speed. Other matrix materials are compositions which comprise enzymes and other biologically active materials, e.g. liquid or solid samples obtained from mammals or compositions containing or derived from such samples, which may be contacted with the modifying agent, e.g. a modifying agent in the form of a film, for example, as part of a medical diagnostic test.

The matrix may be the sole material which takes part in the chemical reaction which is promoted or inhibited by the chemical moiety, or the chemical reaction can involve an additional material, including the coreactants and coadditives discussed below, which is added before or after the modifying agent is treated to change the extent to which the active chemical moiety is exposed to the matrix.

Polymeric Ingredients

The polymeric ingredient in the modifying agent can be (or be derived from) a single polymer or from a mixture of polymers, and the polymer can be a homopolymer, or a copolymer of two or more comonomers, including random copolymers, graft copolymers, block copolymers and thermoplastic elastomers. Preferably at least part of the polymeric moiety is derived from a side chain crystallizable (SCC) polymer. The SCC polymer may for example be derived from one or more acrylic, methacrylic, olefinic, epoxy, vinyl, ester-containing, amide-containing or ether-containing monomers. The molecular weight of an SCC polymer is relatively unimportant to its $T_p$, but is generally an important factor in determining the $T_p$ of other polymers. The preferred SCC polymeric moieties are described in detail below. However, the invention includes the use of other crystalline polymers having the desired properties. Such other polymers include for example polymers in which the crystallinity results exclusively or predominantly from the polymer backbone, e.g. polymers of α-olefins containing 2 to 12, preferably 2 to 8, carbon atoms, e.g. polymers of monomers having the formula $CH_2=CHR$, where R is hydrogen, methyl, propyl, butyl, pentyl, 4-methylpentyl, hexyl or heptyl, as well as other polymers such as polyesters, polyamides, and polyalkylene oxides, for example polytetrahydrofuran.

Even with SCC polymers, the molecular weight of the polymeric moiety is an important factor in determining the rate at which the modifying agent diffuses through the matrix, especially after it has been heated or otherwise treated to increase the availability of the reactive ingredient. Thus in general a low molecular weight is to be preferred; however, too low a molecular weight may result in excessive exposure of the reactive ingredients at temperatures below $T_p$. We have obtained good results with modifying agents having an Mn of 1,000 to 100,000, preferably 1,000 to 50,000, more preferably 1,000 to 20,000, particularly 1,000 to 10,000. Another factor in determining the rate at which the modifying agent mixes with the matrix is the difference between the solubility parameters of the matrix ($\delta_1$) and the modifying agent ($\delta_2$). Preferably the difference between $\delta_1$ and $\delta_2$ is not more than the difference between the solubility parameters of Epon 828 and the homopolymer of $C_{22}$ acrylate. Another factor in determining the rate at which the modifying agent mixes with the matrix at temperatures below $T_p$ is its crystallinity; the greater the crystallinity, the lower the rate. Thus an increase in crystallinity generally increases the stability of the composition at temperatures below $T_p$, but generally does not change the reactivity or catalytic activity of the modifying agent at temperatures above $T_p$. In addition, higher crystallinities often increse the amount of diluents that can be used in the composition. A crystallinity such that the DSC heat of fusion ($\Delta H$) is at least 10 J/g, particularly at least 20 J/g, especially at least 40 J/g, is preferred. The steric nature of the polymeric ingredient can also be significant in determining the availability of the active moiety, especially when it is a stereospecific catalyst. Another factor in determining the rate at which the modifying agent mixes with the matrix above and/or below $T_p$ is the presence of compatibilizing groups on one or more of the matrix, the modifying agent and coadditives added to enhance the compatibility of ingredients of the composition.

It is important that the polymeric ingredient should melt over a relatively small temperature range, so that the extent to which the matrix is contacted by the active chemical ingredient changes sharply when the composition is heated or cooled through the temperature range $T_o$ to $T_p$. The closer $T_p$ is to room temperature (which for most compositions is the expected or preferred storage temperature), the more rapid the transition should preferably be. Thus $T_p-T_o$ is preferably less than $T_p^{0.7}$, particularly less than $T_p^{0.6}$, To and Tp being in ° C. Table 1 below shows (in ° C.) the preferred and particularly preferred values of $T_p-T_o$ for various values of $T_p$.

TABLE 1

| $T_p$ | $T_p-T_o = T_p^{0.7}$ | $T_p-T_o = T_p^{0.6}$ |
|---|---|---|
| 30 | <10.8 | <7.6 |
| 40 | <13.2 | <9.1 |
| 50 | <15.5 | <10.6 |
| 60 | <17.5 | <17.6 |
| 70 | <19.5 | <12.8 |
| 90 | <23.3 | <14.9 |
| 120 | <28.5 | <17.7 |
| 150 | <33.3 | <20.2 |

$T_p$ can vary widely, depending on the conditions under which the composition is to be stored and the temperature to which it can conveniently be heated in order to promote exposure of the matrix to the active chemical ingredient. Thus in general, $T_p$ may be for example 10 to 150° C. For compositions which are to be stored at room temperature (typically 20–30° C.), $T_p$ is preferably at least 40° C., particularly at least 45° C., but not more than 100° C., particularly not more than 85° C., so that the modifying agent can be activated by moderate heating above room temperature. $T_p-T_o$ is preferably less than 10° C., particularly less than 8° C., more particularly less than 6° C., especially less than 4° C.

Preferred SCC Polymers

SCC polymers which can be used in this invention include known SCC polymers, e.g. polymers derived from one or more monomers such as substituted and unsubstituted acrylates, methacrylates, fluoroacrylates, vinyl esters, acrylamides, methacrylamides, maleimides, α-olefins, p-alkyl styrenes, alkylvinyl ethers, alkylethylene oxides, alkyl phosphazenes and amino acids; polyisocyanates; polyurethanes; polysilanes; polysiloxanes; and polyethers; all of such polymers containing long chain crystallizable groups. Suitable SCC polymers are described for example in J. Poly. Sci. 60, 19 (1962), J. Poly. Sci, (Polymer Chemistry) 7, 3053 (1969), 9, 1835, 3349, 3351, 3367, 10, 1657, 3347, 18, 2197, 19, 1871, J. Poly. Sci, Poly-Physics Ed 18 2197 (1980), J. Poly. Sci, Macromol. Rev, 8, 117 (1974), Macromolecules 12, 94 (1979), 13, 12, 15, 18, 2141, 19, 611, JACS 75, 3326 (1953), 76; 6280, Polymer J 17, 991 (1985); and Poly. Sci USSR 21, 241 (1979).

The SCC polymers which are preferably used in this invention can be broadly defined as polymers which comprise repeating units of the general formula

where Y is an organic radical forming part of the polymer backbone and Cy comprises a crystallizable moiety. The crystallizable moiety may be connected to the polymer backbone directly or through a divalent organic or inorganic radical, e.g. an ester, carbonyl, amide, hydrocarbon (for example phenylene), amino, or ether link, or through an ionic salt linkage (for example a carboxyalkyl ammonium, sulfonium or phosphonium ion pair). The radical Cy may be aliphatic or aromatic, for example alkyl of at least 10 carbons, fluoralkyl of at least 6 carbons or p-alkyl styrene wherein the alkyl contains 6 to 24 carbons. The SCC polymer may contain two or more different repeating units of this general formula. The SCC polymer may also contain other repeating units, but the amount of such other units is preferably such that the total weight of the crystallizable groups is at least equal to, e.g. twice, the weight of the remainder of the block.

Preferred SCC polymers comprise side chains containing in total at least 5 times as many carbon atoms as the backbone of the polymer, particularly side chains comprising linear polymethylene moieties containing 12 to 50, especially 14 to 22, carbon atoms, or linear perfluorinated or substantially perfluorinated polymethylene moieties containing 6 to 50 carbon atoms. Polymers containing such side chains can be prepared by polymerizing one or more corresponding linear aliphatic acrylates or methacrylates, or equivalent monomers such as acrylamides or methacrylamides. A number of such monomers are available commercially, either as individual monomers or as mixtures of identified monomers, for example C12A, C14A, C16A, C18A, C22A, a mixture of C18A, C20A and C22A, a mixture of C26A to C40A, fluorinated C8A (AE800 from American Hoechst) and a mixture of fluorinated C8A, C10A and C12A (AE12 from American Hoechst). The polymers can optionally also contain units derived from one or more other comonomers preferably selected from other alkyl, hydroxyalkyl and alkoxyalkyl acrylates, methacrylates (e.g. glycidal methacrylate), acrylamides and methacrylamides; acrylic and methacrylic acids; acrylamide; methacrylamide; maleic anhydride; and comonomers containing amine groups. Such other co-monomers are generally present in total amount less than 50%, particularly less than 35%, especially less than 25%, e.g. 0 to 15%. They may be added to modify the melting point or other physical properties of the polymers. The melting point of a polymer containing such polymethylene side chains is influenced by the number of carbon atoms in the crystallizable side chains. For example, homopolymers of C14A, C16A, C18A, C20A, C22A, C 30A, C40A and C50A respectively typically have melting points of 20, 36, 49, 60, 71, 76, 96 and 102° C., while the homopolymers of the corresponding n-alkyl methacrylates typically have melting points of 10, 26, 39, 50, 62, 68, 91 and 95° C. Copolymers of such monomers generally have intermediate melting points. Copolymers with other monomers, e.g. acrylic acid or butyl acrylate, typically have somewhat lower melting points.

Other polymers which can be used in this invention include atactic and isotactic polymers of n-alkyl α-olefins (e.g. the atactic and isotactic polymers of $C_{16}$ olefin, having $T_m$'s of 30° and 60° C. respectively); polymers of n-alkylglycidyl ethers (e.g. the polymer of $C_{18}$ alkyl glycidylether); polymers of n-alkyl vinyl ethers (e.g. the polymer of $C_{18}$ alkylvinylether having a $T_m$ of 55° C.); polymers of n-alkyl-α-epoxides (e.g. the polymer of the $C_{18}$ alkyl α-epoxide having a $T_m$ of 60° C.); polymers of n-alkyl oxycarbonylamidoethylmethacrylates (e.g. the polymers of C18 IEMA, C22 IEMA and C30 IEMA having $T_m$'s of 56°, 75° and 79° respectively); polymers of n-fluoro alkyl acrylates (e.g. the polymers of $C_8$ hexadecafluoroalkylacrylate, and of a mixture of $C_{8-12}$ alkyl fluoroacrylates having Tm's of 74° and 88° C. respectively), polymers of n-alkyloxazolines (e.g. the polymer of $C_{16}$ alkyl oxazoline having a $T_m$ of 155° C.); polymers obtained by reacting an hydroxyalkyl acrylate or methacrylate with an alkyl isocyanate (e.g. the polymers obtained by reacting hydroxyethyl acrylate with $C_{18}$ or $C_{22}$ alkyl isocyanate and having $T_m$'s of 78° and 85° respectively); and polymers obtained by reacting a difunctional isocyanate, a hydroxyalkyl acrylate or methacrylate, and a primary fatty alcohol (e.g. the polymers obtained by reacting hexamethylene diisocyanate, 2-hydroxyethyl acrylate, and $C_{18}$ or $C_{22}$ alcohols, and having $T_m$'s of 103° and 106° C. respectively).

Preferred SCC polymers used in this invention comprise 30 to 100%, preferably 40 to 100%, of units derived from at least one monomer selected from the group consisting of alkyl acrylates, alkyl methacrylates, N-alkyl acrylamides, N-alkyl methacrylamides, alkyl oxazolines, alkyl vinyl ethers, alkyl vinyl esters, α-olefins, alkyl 1,2-epoxides and alkyl glycidyl ethers in which the alkyl groups are n-alkyl groups containing 12 to 50 carbon atoms, and the corresponding fluoroalkyl monomers in which the thermoalkyl groups are n-fluoroalkyl groups containing 6 to 50 carbon atoms; 0 to 20% of units derived from at least one monomer selected from the group consisting of alkyl acrylates, alkyl methacrylates, N-alkyl acrylamides, alkyl vinyl ethers, and alkyl vinyl esters in which the alkyl groups are n-alkyl groups containing 4 to 12 carbon atoms; and 0 to 15% of units derived from at least one polar monomer selected from the group consisting of acrylic acid, methacrylic acid, itaconic acid, acrylamide, methacrylamide, acrylonitrile, methacrylonitrile, vinyl acetate and N vinyl pyrrolidone. Such SCC moieties may also contain units derived from other monomers to change compatibility with the matrix, or to raise the modulus of a reaction product containing the modifying agent; such monomers include styrene, vinyl acetate, monoacrylic functional polystyrene and the like.

The number average molecular weight of the SCC polymer is preferably less than 200,000, more preferably less than 100,000, particularly less than 50,000, more particularly 1,000 to 20,000. The molecular weight of the SCC polymer can be adjusted (for example through choice of the reaction conditions and addition of chain transfer agents) so as to optimize the reactivity of the active chemical ingredient without substantial change in $T_p$.

When the crystalline polymer ingredient becomes incorporated in the final product, especially when it becomes chemically linked to the matrix, e.g. incorporated in a crosslinked polymeric structure, its presence often has an effect on the properties of the final product. Preferably, therefore, it is selected so as to provide improved properties, for example an improvement in tensile strength, elongation, toughness, flexibility, adhesion (e.g. to steel, glass, wood or polyethylene or other organic polymer), or resistance to degradation by moisture or other chemicals, pests, mildew, fungus, light or other electromagnetic radiation, heat or burning. For example, we have found that when a crosslinked epoxy resin is prepared using a modifying agent in which the crystalline moiety is an SCC polymer, the toughness and/or adhesive strength of the resin can be enhanced. On the other hand, the presence of the SCC polymer can cause an undesirable reduction in the $T_g$ of the product. In one embodiment, the modifying agent comprises, in addition to a crystalline ingredient, a second polymeric ingredient which becomes covalently linked, through the reactive ingredient, to a polymer, e.g. crosslinked polymer, and which imparts desired properties to the final product. The second polymer may be for example an amorphous polymer or a crystalline polymer having a melting point higher or lower than $T_p$. In one embodiment, the polymer comprises a thermoplastic elastomer (TPE), for example one in which an active chemical moiety is attached to the hard block, and the soft blocks have a toughening effect on the final product. For example, the TPE can include SCC hard blocks and amorphous soft blocks. The SCC hard blocks can for example be derived from SCC polymers as described above. The amorphous soft blocks can for example have a $T_g$ of −60 to 150° C., preferably −60 to 120° C. Suitable soft blocks can for example be derived from one or more of butyl acrylate, ethyl hexylacrylate, and butadiene. Suitable SCC TPE's to which active chemical moieties can be attached are disclosed for example in commonly assigned U.S. Pat. Application Ser. Nos. 07/773,047, 07/957,270 and 08/048,280 (Docket Nos. 9213, 9213-1 and 9213-2) and in published PCT Application Nos. PCT/U.S. Ser. No. 92/08508 and PCT/U.S. Ser. No. 94/04138 (Docket Nos. 9213-1-PCT and 9213-2-PCT), the disclosures of which are incorporated herein by reference.

Active Chemical Ingredients

The selected active chemical ingredient can be a catalytic ingredient (including an initiator), a reactive ingredient, or an inhibiting ingredient. The way in which an ingredient behaves (i.e. as a catalytic, reactive, or inhibiting ingredient) may depend upon the matrix material: for example, an amine group may be catalytic in some circumstances and reactive in other circumstances. The modifying agent preferably contains at least 5%, particularly at least 10%, of the active chemical ingredient. The modifying agent can contain two or more different active chemical ingredients, in which case each can be a catalytic ingredient, or each can be a reactive ingredient, or one or more can be a catalytic ingredient and the other or others a reactive ingredient. The active chemical ingredient can contain, for example, nitrogen, e.g. as a primary, secondary, tertiary or quaternary amine, or as an imidazole or other cyclic structure for a Tp containing nitrogen; phosphorus, e.g. as a —$PR_3$ group, where R is an organic radical; oxygen, e.g. as a carboxyl, ester or amide group; a metal or metal-containing group, e.g. a transition metal such as rhodium, cobalt, copper, vanadium or manganese, or a main group metal such as aluminum, tin, or lead, or a metal alkoxide, for example attached to the polymeric moiety through one or more ligand groups; or a peroxide initiator, e.g. benzoyl peroxide, t-butyl perbenzoate or t-butyl peroctoate.

Chemical ingredients which are particularly useful in this invention include amines (including primary, secondary, tertiary and quaternary amines, and heterocyclic amines such as imidazoles); carboxyl groups; sulfonate groups; phosphines; main group metals, including tin; transition metals, including cobalt, lead, titanium and rhodium, e.g. as $[(C_2H_4)_2 RhCl]_2$, and acetylacetonate esters of transition metals; enzymes; superacids; metal alkoxides; UV-activated moieties, e.g. 4-vinylbenzophenone; Michler's ketone; and acetophenone; and groups which are converted into such groups when the modifying agent is used.

Modifying Agents Containing Catalytic Chemical Ingredients

The invention can make use of any modifying agent in which a catalytically active chemical ingredient is bonded or otherwise associated with to a temperature-sensitive polymeric ingredient. Reactions which can be catalyzed by such modifying agents include polymerizations, e.g. polymerizations of one or more olefinically unsaturated monomers (particularly one or more olefins, optionally with one or more substituted olefins), and ring-opening polymerizations, hydrogenations, hydroformylation reactions, enzyme-catalyzed reactions (e.g. in the production of foods, including cheese, and pharmaceuticals, in medical diagnostic procedures, and in the treatment of waste products), oxidations, reductions, etc. The catalytic modifying agent can remain in the catalyzed reaction mass, or, in one embodiment, the catalytic ingredient is covalently bonded to the polymeric ingredient, and the catalyzed reaction mass is one which is fluid while the reaction is taking place and remains fluid when it is cooled and/or treated in some other way (e.g. by addition of another ingredient) so that the catalytic modifying agent precipitates out as a solid and can be removed (e.g. by filtration or centrifuging). The recovered catalytic modifying agent can then be used again. The modifying agent can optionally be retained in the reaction vessel by filtration within the vessel, to which fresh matrix material is then added before heating (or otherwise treating) the modifying agent to reexpose the catalytic moieties.

One example of a catalytic modifying agent is one obtained by attaching rhodium (a transition metal) to a polymer prepared by the technique disclosed in JACS 100 264 (1978), Stille et al, the disclosure of which is incorporated by reference, using a monomer like C18A or C22A (or other SCC polymer precursor) in place of the styrene or hydroxyethyl acrylate used by Stille. The resulting modifying agent could be used, at a temperature above $T_p$, to catalyze a reaction, for example the hydrogenation of an alkene, e.g. hydrogenation of α-N-acylaminoacrylic acid to the corresponding amino acid.

Another example of a catalytic modifying agent is one containing an enzyme, for example an enzyme attached to the polymeric ingredient through formation of a Schiff base (e.g. through reaction of a primary amine on the enzyme with an aldehyde group on the polymer, for example on a unit derived from acrolein, copolymerized with one or more SCC precursor monomers). A suitable enzyme is for example B-galactosidase, which, at a temperature above $T_p$, but not at a temperature below $T_q$, would react with D-thiogalactopyranoside IPTG, as could be observed by a color change from white to blue.

Another example of a catalytic modifying agent is one containing a free radical initiating group, or a group which becomes a free radical initiating group (a) through reaction with an ingredient of the matrix material or (b) as a result of (i) the treatment which exposes the active chemical ingredient or (ii) a further treatment. For example, the matrix material can be a photopolymerizable polymeric composition and the active chemical ingredient can be a free radical initiator. Such a composition will not polymerize when exposed to light while the modifying agent is in solid particulate form, or when the composition is heated in the absence of light, but will polymerize rapidly when exposed to light while it is being heated or after it has been heated. The modifying agent can contain only the active chemical ingredient which is needed to initiate the reaction or it can in addition contain a reactive group so that it becomes chemically bonded to the matrix material.

In one embodiment of the invention, catalysts for use in the preparation of polyurethanes, polyureas and polyisocyanurates provide the active chemical ingredient in the modifying agent. Such catalysts include for example compounds containing tin, lead, or another metal known to catalyze such reactions, e.g. tris(tributyltin) oxide, dibutyltin laurate, tributyl tin acetate, dibutyltin acetoacetate, or tributyl tin methacrylate. In another embodiment of the invention, catalysts for use in the curing of unsaturated polyesters (including polyvinyl esters) provide the active chemical ingredient in the modifying agent. Such catalysts include for example compounds containing cobalt, or another transition metal. In both these embodiments, the catalyst-containing compound can be dispersed in the crystalline polymer without any chemical bonding between it and the polymeric ingredient, or some or all of it can be bonded to the polymeric ingredient through a chemical bond, e.g. a covalent, ligand, or ionic bond. For example, a metal compound containing carboxyl, hydroxyl or other polar groups can interact with the same or similar groups on the polymer; and a metal compound containing long chain alkyl groups can interact with similar groups on an SCC polymer. Thus, by increasing the proportion of units derived from acrylic acid and/or other polar comonomers in an SCC polymer, it is possible to increase the stability of a modifying agent comprising the SCC polymer and a metal compound containing polar groups. In these two embodiments it is also possible for the modifying agent to contain another active chemical ingredient, which may be another catalytic ingredient or a reactive ingredient. For example, a modifying agent containing a tin compound, e.g. dibutyl tin dilaurate (DBTDL) and a tertiary amine, e.g. tetraethylene diamine (TEDA), can be prepared for example by mixing the tin and amine compounds with the molten polymer, cooling and forming into particles. Such a modifying agent can also contain a blowing agent, e.g. BL from Air Products. A typical modifying agent would contain 75% SCC polymer, 10% TEDA, 10% DBTDL and 5% BL. The tin compound can be chosen so that it forms a chemical bond with the polymer, e.g. tributyl tin methacrylate. The amine compound can likewise be chosen so that it forms a chemical bond with the polymer, e.g. dimethylamino ethyl acryate.

Modifying Agents Containing Reactive Chemical Moieties

This invention can make use of any modifying agent in which a reactive chemical ingredient is associated with a temperature-sensitive polymeric ingredient. The reactive ingredient reacts, and forms a permanent chemical bond, with at least one ingredient of the matrix in which the modifying agent is distributed.

Examples of reactive chemical ingredients, and monomers from which they may be derived, include (a) isocyanato [as in isocyanatoethylmethacrylate (IEMA), methacryloylisocyanate (MAI) and isopropenyl dimethyl benzyl isocyanate (TMI)]; (b) anhydride [as in maleic anhydride and itaconic anhdride]; (c) acyl halide [as in methacryloyl chloride and acryloyl chloride]; (d) aldehyde [as in acrolein and methacrolein]; (e) hydroxyl [as in hydroxy ethyl acrylate (HEA) or methacrylate and hydroxy butyl acrylate or methacrylate]; (f) alkyl or aryl halide [as in vinyl benzyl chloride (VBC)]; (g) amide [as in acrylamide and methacrylamide]; (h) amine, including saturated and unsaturated heterocyclic amine [as in dimethyl aminoethyl acrylate or methacrylate, vinyl imidazole and 1-(2-aminoethyl) imidazole attached through IEMA]; (i) carboxyl [as in acrylic or methacrylic acid]; j) primary or secondary amines [as in triethylenetetraamine connected through IEMA or GMA or maleic anhydride]; (k) epoxide [as in glycidyl acrylate or methacrylate)GMA)]; (l) mercaptan connected through multiple bonds; (m) azo and peroxy [as in 4,4'-azobis (4-cyanovaleric acid) or 4,4'-azobis (4-cyanovaleroyl chloride) connected through HEA]; and (n) carbamate and urea [as in amino functional and hydroxy functional compounds, e.g. 1-(2-aminoethyl)imidazole and 1-(2-hydroxyethyl)imidazole connected through IEMA].

In one preferred embodiment, the present invention makes use of modifying agents in which crystalline and reactive chemical ingredients are chemically bonded to each other and which are used to provide compositions comprising two or more ingredients which will react with each other at a rate which is comparatively slow (and preferably negligible for practical purposes) below a particular temperature, but which will react with each other rapidly when the composition is heated to a temperature which is above, but not necessarily far above, that temperature. Such compositions can be stored for extended periods below that temperature, but will react rapidly when heated above that temperature. Compositions of this kind are often referred to as "latent", "one part" or "one package" formulations. Preferred compositions of this embodiment of the present invention (whether the modifying agent contain a reactive or a catalytic chemical moiety) can be stored for at least 1 month, and preferably at least 6 months, at 40° C. without doubling in viscosity, but will cure, preferably at a rate such that they do not flow in at most 1 hour, when heated to a temperature substantially over $T_p$. They are particularly useful as adhesives, coatings, compositions for impregnating fabrics, e.g. glass fiber fabrics, to produce materials often referred to as "prepregs", compositions for creating foams, and compositions for use in reaction injection molding (RIM) and sheet molding compound (SMC) applications. The matrix materials in one-part formulations may be for example epoxies, epoxy novolacs, cyanates, isocyanates, urethanes, acrylics, phenolics, cyanoacrylates, silicones, unsaturated polyesters, polysulfides, and other precursors for thermoset polymers.

The reactive modifying agent may alternatively or additionally produce a color change in the matrix, by bleaching it or by reacting to form a leuco dye or other colored product, e.g. as part of a medical diagnostic system, for example a system in which an enzyme reacts with an active chemical ingredient, or an enzyme (as the active chemical ingredient) promotes or inhibits a reaction of the matrix. For example, the active chemical species may react to form an intensely colored species, as in leuco dye formation as applied to colorimetric indicating systems.

Although the modifying agents are particularly useful in one-part formulations, the invention includes their use in processes in which at least one of the ingredients for the finished product is added during or after the treatment which increases the availability of the reactive chemical ingredient.

Modifying Agents Containing Inhibiting Chemical Ingredients

This invention can make use of any modifying agent in which an inhibiting chemical ingredient is bonded to or otherwise associated with a temperature-sensitive polymeric ingredient. The inhibiting ingredient reduces the rate of a chemical reaction of the matrix, optionally by itself reacting preferentially with an external agent or material, e.g. oxygen, a free radical, or a biologically active material, which would otherwise react with the matrix, and thus inhibit reaction between that external agent or material and the matrix. The external agent or material can be present at the surface of the matrix and/or have diffused into the matrix. For example, the reactive ingredient can act as an antioxidant, herbicide, mildewcide, fungicide, bactericide, disinfectant, deodorizer, insecticide, fertilizer, flame retardant or ultraviolet stabilizer.

Mixtures of Modifying Agents

Two or more modifying agents can be used together, differing in the active chemical ingredient or the polymeric ingredient or both. When the polymeric ingredients differ, the reaction can be carried out in one step at a temperature above the activation temperature of both (or all of the) modifying agents, or in two or more steps at increasing (or decreasing) temperatures selected to activate one or more desired modifying agents. In this way, for example, a first step can be carried out with one catalyst or reactant at a desired concentration, and a second step with the same catalyst or reactant at a higher (or lower) concentration, or with the first catalyst or reactant and a second catalyst or reactant. When a catalyst is used, the second catalyst can catalyze the same reaction as the first catalyst or a different reaction; in the latter case, the second catalyst can be at a concentration such that the reaction catalyzed by the first catalyst is inhibited. We believe that such mixtures may be particularly useful in medical diagnostic kits.

Association Between the Polymeric and Active Ingredients of the Modifying Agent

The nature of the association between the polymeric ingredient and the active chemical ingredient is an important factor in determining the rate at which the matrix is contacted by the active ingredient. Generally, the stronger the association, the less the contact at temperatures below $T_p$, and the better the storage stability (or "latency"). On the other hand, weaker association promotes rapid reaction near and above $T_p$. In many cases, it is preferred that at least part, and preferably all, of the active ingredient is linked to the polymeric ingredient through a chemical bond, particularly a covalent bond, especially one having a bond strength of at least 10 Kcal/mole, because such bonds do not undergo reversible disassociation (as do ionic and Van der Waal bonds), and, therefore, provide better storage stability. However, modifying agents in which the bonds are partially covalent and partially ionic, or ionic, can also be useful, especially if the required latency period is short.

However, there are also situations in which storage stability is not desired or cannot be achieved in combination with an acceptable rate of reaction at temperatures above $T_p$. Under these circumstances, it may be preferable to make use of a modifying agent in which at least part of the active ingredient is bound to the polymeric ingredient physically but not chemically. This may produce a delay (as compared to the active chemical ingredient on its own) which is as short as a few seconds or as long as 12 hours. For example, when highly reactive mixes of polyurethanes or other polymers are being shaped by molding, e.g. by reaction injection molding (RIM) (for example when making foamed products), a physically bound modifying agent allows the active chemical ingredients to be released very rapidly, but provides sufficient delay to ensure that curing does not begin before the polymeric mixture is uniformly distributed throughout the mold. Another situation where a physically bound modifying agent is useful is when coatings are heated (e.g. with a hot wand) after being applied to a substrate. The invention makes it possible to make up a "day batch" which can be used over a period of several hours. When part or all of the active ingredient is physically, but not chemically, bound to the polymeric ingredient, the strength of the association can be influenced by hydrogen bonding and/or physical interaction between the groups on the two ingredients, e.g. carboxyl, hydroxyl or other polar groups, or long chain alkyl groups, on both ingredients.

Physical Form of the Modifying Agent

The modifying agent is preferably in the form of solid particles which are uniformly dispersed in a solid or liquid matrix. The smaller the particles are, the easier they are to disperse and maintain in a uniformly dispersed state. On the other hand, the smaller the particles, the lower the ratio of active chemical moieties hidden within the particles to those exposed on the surface of the particles, and the less the potential storage stability of the composition. This ratio decreases as the size of the particles decreases and also is higher for spherical particles than for particles of other shapes. It is, therefore, preferred to use substantially spherical particles having an average size of 0.1 to 150, more preferably 0.1 to 50, particularly 0.1 to 25, especially 0.1 to 10, microns. Preferably each of the particles is within these ranges. If the particles employed are not spherical, preferably their ratio of external area to volume corresponds to these ranges. Particle size can be determined using commercially available instruments in which a laser beam is diffracted by the particles, and the particle size is calculated from the resulting diffraction pattern. Suitable particles can be produced by known techniques, including spray drying, impact pulverizing, and agitation in a fluid followed by cooling to freeze the particle size.

The modifying agent may also be in the form of a film, which may be self-supporting or a layer on a support.

Relative Amounts of Modifying Agent and Matrix

The relative amounts of modifying agent and matrix may vary widely, depending on the nature and concentration of the active chemical ingredient in the modifying agent, the conditions to which the composition is subjected, and the desired result. Generally the composition contains 0.01 to 50% of the modifying agent. When the active chemical moiety is a catalytic moiety, the modifying agent preferably contains 1 to 40% thereof, particularly 1 to 10% thereof. When the active chemical moiety is a reactive moiety, preferably the modifying agent contains at least 5%, more preferably at least 15%, particularly at least 20%, e.g. 15 to 40%, especially 20 to 35%, thereof.

Process Characteristics

The modifying agent can be contacted with the matrix in any desired way. The resulting composition is then maintained at a temperature below $T_p$ until the time comes to promote or inhibit the chemical reaction. Heating and cooling are the preferred ways of changing the extent to which the matrix is contacted by the active chemical ingredient. However, other measures can be used in addition to, or instead of, heating or cooling. For example, a solvent can be added, the concentration of a solvent can be changed (including the addition of a non-solvent), or an ingredient can be added to raise or lower the pH of the composition, or the composition can be exposed to ultra-violet light or other suitable electromagnetic radiation, or to ultrasonic radiation. Heating can be effected by external heating, e.g. by radiant heat or with a hot air gun, or by heat generated internally, e.g. radio frequency, ultrasonic, resistance or induction heating. The composition may contain, or be placed adjacent to, a material which is selected to provide or enhance such heating, e.g. graphite or carbon black dispersed in the composition, or electrical resistance heating means, e.g. metal or graphite wires, plates or other members within the thickness of, or adjacent to, the composition. The composition is preferably heated to at least $T_p$, particularly at least $(T_p+5)°$ C. If desired, the composition can be agitated or otherwise treated during or after the heating, in order to increase the rate at which the active chemical ingredient is exposed to the matrix.

Coreactants

Under certain circumstances, the active chemical ingredients of the modifying agent promotes a reaction between the matrix material and an added coreactant. The coreactant preferably has one or more of the features listed below:
1. It decreases the viscosity of the resin material.
2. It decreases the latency of the modifying agent.
3. It acts as a coadditive or conditioner, as well as a coreactant.
4. It increases the $T_g$ of the final resin product.

Preferred coreactants for epoxy resin cures are anhydrides, in particular, methyl tetrahydrophthalic anhydride (MeTHPA). Addition of between about 20% to 50% by weight MeTHPA, preferably between about 25% to 45%, to Epon 828 decreases the viscosity of the epoxy resin by over an order of magnitude from 13,000 cps to 670 cps. Decreasing the viscosity of the matrix material makes it much easier to add the modifying agent to the matrix material before the mixture becomes too viscous to handle, and makes it possible to increase the proportion of fillers. The anhydride also reduces the latency of the composition, e.g. to 30 days at 25 to 40° C. Such latency periods are sometimes desired because they indicate that curing will take place rapidly at cure temperatures.

Coadditives

The compositions of the first preferred aspect of the invention, which comprise the matrix material and the modifying agent, can contain one or more other ingredients which have a useful effect, and which are referred to herein as coadditives. For example, such an ingredient can (a) help to achieve good distribution of the solid modifying agent in the matrix material and/or reduce the time needed to distribute the solid modifying agent in the matrix; (b) help to stabilize the composition before the treatment which exposes the active chemical ingredient; (c) have a desired effect on the manner or extent to which the active chemical ingredient is exposed by such treatment; (d) have a desired effect on a chemical reaction which takes place after such treatment, e.g. to increase the rate of reaction and/or to lower the temperature at which the reaction takes place; or (e) have a desired effect on the product of such a chemical reaction, e.g. on its stability or its physical characteristics such as strength, toughness, flexibility, color or surface smoothness. A single coadditive can perform two or more of these functions. The total amount of coadditive is preferably 0.05 to 50%, based on the "formula weight". The term "formula weight" is used herein to denote the combined weight of the modifying agent and the matrix, but excluding any non-reactive, e.g. inorganic, fillers.

Specific examples of useful coadditives are (a) partial salts of acidic polyesters, e.g. the material sold under the trade name W-990 by Byk Chemie; (b) methylalkyl polysiloxanes modified by polyethers, e.g. the material sold under the trade name A-530 by Byk Chemie; (c) phenols, including n-alkyl phenols in which the n-alkyl group contains 6 to 20 carbon atoms, e.g. nonyl phenol, 3-pentadec-8-ene-1-yl phenol, e.g. the material sold under the trade name NC-700 by Cardolite, and bisphenol A, (d) glycidyl ethers of phenols, including the phenols just noted, including. 3-pentadec-8-ene-1-yl phenyl glycidyl ether, e.g. the material sold under the trade name NC-513 by Cardolite, and nonyl phenyl glycidyl ether, e.g. the material sold under the trade name Heloxy Modifier 64 by Shell Chemical; (e) polyfunctional epoxy resins, including oxirane, 2,2'-((1-methylethylidene)bis(4,1-phenyleneoxy(1-(butoxymethyl)-2,1-ethanediyl) oxymethylene))bis-, e.g. the material sold under the trade name XB-4122 by Ciba-Geigy, 4-(8-(4-glycidyl phenyl) pentadecanyl) phenyl glycidyl ether, e.g. the material sold under the name NC-514 by Cardolite, 4-(pentadecan-8,9,oxo-1-yl) phenyl glycidyl ether, e.g. the material sold under the trade name NC-551 by Cardolite, and the polyglycidyl ether of an alkenyl phenol formaldehyde novolac resin, e.g. the material sold under the trade name NC-547 by Cardolite; (f) secondary alcohol ethoxylates, e.g. the material sold under the trade name Tergitol 15-S-3 by Union Carbide; (g) quaternary alkyl ammonium halides, e.g. di-hexadecyldimethyl ammonium chloride and alkyl benzyl dimethyl ammonium chlorides; (h) fatty acid and amides thereof; (i) dimer acids; (j) fluorocarbon surfactants having lower surface energies than the modifying agent, e.g. Fluorad FC-43 available from 3M and the Lodyne products available from Ciba Geigy; and (k) alkenyl succinic anhydrides such as nonenyl and dodecenyl succinic anhydrides. Other surface active agents are listed in McCucheon's Handbook of Emulsifiers and Detergents.

Many of the useful coadditives are surface active agents comprising (a) one or more groups which are compatible with the modifying agent, and (b) one or more groups which are compatible with the matrix or with a product of a chemical reaction of the matrix after the modifying agent has been exposed. Such coadditives can be small molecules, oligomers or polymers, e.g. block copolymers. Groups of type (a) include non-polar groups such as alkyl, fluoroalkyl, and alkyl styrene groups wherein the alkyl group contains at least 6, preferably at least 9, e.g. 9 to 50, carbon atoms and is preferably an n-alkyl group. Groups of type (b) include groups in the matrix material, e.g. the group or groups which take part in a polymerization or crosslinking reaction when the solid modifying agent is exposed, for example a polar group such as an epoxy, hydroxyl, carboxyl, amine, ammonium, ether, ester, amide, sulfonamide, sulfonic acid, sulfonic acid salt or phosphate group. For matrix materials which are epoxy resins, preferred surface active agents have an HLB ratio (the ratio of hydrophilicity to lipophilicity) less than 10.

One class of coadditives can be classified as viscosity-reducing additives. These reduce the viscosity of the matrix material so that dispersion of a modifying agent therein is achieved more rapidly and/or more efficiently. The improved dispersion can be achieved when the solid modifying agent is dispersed in the matrix material and/or when the solid modifying agent is heated (and/or otherwise treated) to increase the exposure of the active chemical moiety. The amount of viscosity-reducing agent is preferably 1 to 50%, based on the formula weight. For matrix materials which are epoxy resin precursors, suitable viscosity-reducing agents include alkyl, preferably $C_{12-14}$ alkyl glycidyl ethers, nonyl phenyl glycidyl ether and dimer fatty acid diglycidyl ester, e.g. the materials sold under the trade names Heloxy Modifier 8, Heloxy Modifier 64 and Heloxy Modifier 71 respectively by Shell Chemical; epoxidized alpha olefins, e.g. the materials sold under the trade names Vikolox 14 and Vikolox 18 by Elf Atochem North America; oxirane, 2,2'-((1-methylethylidene)bis(4,1-phenyleneoxy(1-(butoxymethyl)-2,1-ethanediyl)oxymethylene))bis-, e.g. the material sold under the trade name XB-4122 by Ciba-Geigy; and 3-pentadec-8-ene-1-yl phenyl glycidyl ether, e.g. the material sold under the trade name NC-513 by Cardolite and 4-(8-(4-glycidyl phenyl) pentadecanyl) phenyl glycidyl ether, e.g. the material sold under the name NC-514 by Cardolite; and 4-(pentadecan-8,9,oxo-1-yl) phenyl glycidyl ether, e.g. the material sold under the trade name NC-551 by Cardolite.

Another class of additives can be classified as melt flow agents. These associate with the modifying agent so that it flows more easily after it has been treated to expose the active chemical ingredient. The melt flow agent can for example plasticize the polymeric ingredient so that the polymeric chains are more mobile. In one embodiment, the polymeric ingredient stend to form hydrogen bonds with each other, and the melt flow promoting agent is a compound which forms hydrogen bonds with the polymeric ingredients, thus reducing the extent of the hydrogen bonding between them. Melt flow agents can be used in amount 1 to 50%, e.g. 5 to 20%, based on the formula weight. Examples of melt flow agents are dioctyl phthalate, dioctyl adipate, stearamide, butyl acetate, epoxidized soybean oil (e.g. the material sold under the trade name Vicoflex 7170 by Atochem), n-ethyl-o,p-toluene sulfonamide (e.g. the material sold under the trade name Santicizer 8 by Monsanto, and the material sold under the trade name NC700 by Cardolite.

Another class of additives can be classified as compatibilizers. These improve the compatibility of the modifying agent and the matrix material, and thus allow more intimate contact and mixing. Compatibilizers are preferably used in amount 1 to 50%, based on the formula weight. Examples of compatibilizers are block copolymers comprising units derived from one or more alkyl acrylates and one or more glicidyl ethers, e.g. a block copolymer of tetradecylacrylate and phenyl glicidyl ether; block copolymers comprising units derived from one or more alkyl acrylates and styrene, e.g. a block copolymer of tetradecyl acrylate and styrene; and epoxy novolacs, e.g. that available under the trade name NC-547 from Cardolite.

Another class of additives can be classified as low surface energy agents. Low surface energy agents prevent the cured resin from exhibiting a rippled surface. It is believed that the rippling occurs because the air-epoxy surface becomes rich in modifying agent and cures fastest, whereas the bulk epoxy phase cures more slowly and shrinks. The low surface energy agents have a lower surface energy than the modifying agent, and are preferentially located at the air-epoxy resin interface. The low surface energy agents thus minimize the accumulation of the modifying agent at the air-epoxy interface and permit a more homogeneous curing process. Preferred low surface energy agents are fluorocarbon surfactants, e.g. Fluorad FC-430 by 3M or Lodyne products from Ciba-Geigy.

Preferred coadditives for epoxy resins include alkenyl succinic anhydrides, e.g. nonenyl succinic anhydride available from Humphrey under the tradename K-9 and dodecenyl succinic anhydride. The amount of coadditive is generally 0.5 to 10%, preferably 0.5 to 5%, e.g. 2% to 4%, based on the weight of the epoxy resin. In this weight range the coadditive often improves the uniformity and/or gloss of the cured resin. During incubations of 20 minutes at 177° C., 60 minutes at 120° C., and 120 minutes at 100° C., the cured resin exhibited a minimal amount of chalking when used either as an adhesive or as a coating. The latency of the modifying agent at ambient temperature was not affected. Other preferred coadditives include dodecyl benzene sulphonic acid available under the tradename Nacure 5076, methyl tetra hydro phthalic anhydride, nonyl phenol and pentadec-1-yl phenol.

Generally, the coadditive is added to the matrix material, before or after adding the modifying agent. However, on occasion it may be preferable for some or all of the coadditive to be embedded in the crystalline polymer ingredient, in which case, the coadditive is released therefrom when the modifying agent is heated above $T_p$.

The effect produced by a particular coadditive will depend upon the amount thereof, the matrix material and the modifying agent. However, those skilled in the art will have no difficulty, having regard to their own knowledge and the disclosure in this specification, in selecting suitable coadditives.

Enhancing Groups

Many of the valuable effects which can be produced by the functional groups of the coadditives discussed above can also be obtained by attaching such functional groups to the modifying agent or the matrix or both. Such attached groups are referred to herein as "enhancing" groups. For example, it is possible to make use of (i) a modifying agent which includes, chemically bonded thereto, one or more enhancing groups which are compatible with the matrix or with a product of a chemical reaction of the matrix after the modifying agent has been exposed, and/or (ii) a matrix which includes, chemically bonded thereto, one or more enhancing groups which are compatible with the crystalline polymer ingredient of the modifying agent.

A particularly valuable use of enhancing groups is to introduce polar groups, particularly carboxyl groups, into the polymeric ingredient of a modifying agent which contains reactive chemical ingredients and which is to be used in making a cured epoxy resin. We have found that in the absence of such enhancing groups, the cured epoxy resin will not have optimum properties unless the modifying agent is allowed to equilibrate with the matrix before curing takes place. Such equilibration (or "conditioning") may be, for example, for 12–24 hours at 35–40° C. We have found that the need for such conditioning can be reduced or eliminated by introducing carboxyl groups into the crystalline polymer. In a preferred embodiment, the crystalline polymer contains units derived from maleic anhydride, and the resulting anhydride group is reacted with an amino compound to form an amic acid. The polymer can be for example a copolymer of one or more long chain α-olefins and maleic anhydride, e.g. Petrolite X8040, or a copolymer of one or more long chain alkyl acrylates, e.g. C22A, and maleic anhydride. The amino compound may contain the reactive chemical moiety which, when exposed, will take part in the curing of the epoxy matrix, e.g. 1-(2-aminoethyl)-2-methyl imidazole. It is also possible for the residue of the amino compound to be further reacted to provide the active chemical moiety; for example ethanolamine can be reacted with the anhydride group and the resulting amic acid reacted with 2-ethyl-4-methyl imidazole or 2-methyl imidazole.

Enhancing groups of this type are particularly useful when the modifying agent is physically, but not chemically, bound to the matrix, since conditioning of such modifying agents is apt to cause reaction with the matrix.

Preconditioning the Modifying Agent

Another way of overcoming the need to condition the modifying agent in the final mixture is to premix the modifying agent with an epoxy compound which has relatively low viscosity, so that it will accept a high concentration of the modifying agent. The resulting concentrate can readily be dispersed in the final mix. Preferred low viscosity epoxy compounds are cycloaliphatic epoxy resins, e.g. 3,4-epoxycyclohexylmethyl-3,4-epoxy-cyclohexane-carboxylate, vinyl cyclohexene dioxide, and bis (3,4-epoxy cyclohexyl) adipate, which are available from Union Carbide under the trade names ERL-4221, ERL-4206 and ERL-4299, respectively.

Synthesis of the Modifying Agents

There are many synthetic routes by which modifying agents useful in this invention can be prepared, as summarized in the sixth and seventh preferred aspects of the invention. Specific examples of suitable syntheses are shown in the Examples below.

Use of the Modifying Agents in the Synthesis of Chemical Compounds

The present invention provides a new route for the preparation of chemical compounds, many of which are themselves novel chemical compounds or are novel in the particular form in which they are prepared. Examples of final products which can be prepared by the present invention include (i) a coating for a printed circuit board; (ii) an encapsulant for an electrical component; (iii) a resist on a substrate which is to be plated or etched, especially a photoresist; (iv) a foam (flexible or rigid); (v) a polymeric material having covalently linked thereto a group which will act as an antioxidant, herbicide, mildewcide, fungicide, bactericide, disinfectant, deodorizer, insecticide, fertilizer, flame retardant, ultraviolet stabilizer, or catalyst; (vi) a medical diagnostic material; (vii) an ion exchange membrane; (viii) a filtration medium; (ix) an adhesive; (x) a semi-permeable membrane; (xi) an imaging film; (xii) an information storage medium; (xiii) an orthopedic cast; (xiv) a reinforcing member; (xv) a composite, e.g. an epoxy graphite composite; (xvi) a paint or a coating (including an enamel paint); (xvii) a powder coating; or (xviii) an electrically insulating coating on a conductor, e.g. an epoxy or polyester coating on a wire or a coil.

These final products, and their heat-activatable precursors, form part of the present invention. Of particular interest are the myriad known uses for epoxy resins, e.g. as adhesives and prepregs, and for foamed polyurethanes or the like. Such known uses include use as adhesives in the manufacture of automobiles, and use of prepregs to reinforce concrete structures against earthquakes or against weakness caused by corrosion of reinforcing bars. Also of particular interest are unsaturated polyester thermoset resins useful for structural and functional parts in automobiles, household appliances, furniture, tools and office machines, and as building panels. The compositions are also valuable in heat-curable orthopedic casts and pressure-sensitive adhesives, and resin systems for reinforcement in fiberglass pipes and printed circuit boards.

EXAMPLES

The invention is illustrated by the following Examples, some of which are comparative examples. Examples 1–31 show the preparation of modifying agents, and are summarized in Table 2 below. Examples A–Z show the use of the modifying agents (a number of the Examples being comparative Examples), and Examples A–J are summarized in Table 3 below.

The ingredients (and amounts thereof in grams) used in Examples 1–6, and the properties of the products, are shown in Table 2. The following abbreviations are used in the description below and in Tables 2 and 3. C22A is docosanyl acrylate; C18A is octadecyl acrylate; C12A is dodecyl acrylate; C4A is butyl acrylate; HEA is 2-hydroxyethylacrylate; C1M is methyl methacrylate; MA is maleic anhydride; AA is acrylic acid; IEMA is isocyanato-ethyl methacrylate; DMAEA is N,N-dimethylaminoethyl acrylate; VDP is vinyldiphenyl phosphine; LDA is lithium diisopropylamide; CDP is chlorodiphenyl phosphine; TBT is tri-n-butyl methacrylate; AMZ is 1-(2-aminoethyl)-2-methylimidazole; API is 1-(3-aminopropyl) imidazole; EMI is 2-ethyl-4-methyl imidazole; 2EZ is 2-ethyl imidazole; AMI-2 is 2-methyl imidazole; DABCO 33LV is a 33% solution of diazabicyclooctane (DABCO) in an oil carrier available from Air Products under the trade name DABCO 33 LV; AIBN is azo bis (isobutyronitrile); TAP is t-amyl peroxy 2-ethyl hexanoate; BPB is t-butyl peroxybenzoate; $CBr_4$ is carbon tetrabromide; C12SH is dodecane thiol; Petrolite is a copolymer of equal parts of maleic anhydride and a mixture of olefins containing an average of 40 carbon atoms, and is available under the trade name Petrolite 8040; $M_w$ is weight average molecular weight in Daltons; $M_n$ is number average molecular weight in Daltons; DGEBA is the diglycidyl ether of Bisphenol A available from Shell under the tradename Epon 828; Kelpoxy G 272-100 is an epoxy resin available from Reichold Chemicals and is a reaction product of an epoxy resin and a mixture of carboxyl-terminated polybutadiene and similar materials sold by B. F. Goodrich under the tradename CTBN; Pluracol is a hydroxy-terminated polyether available from BASF under the tradename Pluracol P1010; Isonate is 4,4'-methylene bis(phenylisocyanate) available from Dow Chemical under the tradename Isonate 143L; Ancamine 1110 is dimethylamino-methyl phenol available from Air Products Inc.; DBU is diazobicycloundecene from Air Products; D8 is a hydroxy terminated linear polyester polyol available from Bayer under the tradename Desmophen 800; D1150 is a polyester polyol available from Bayer under the tradename Desmophen 1150; Olin G36-272 is a trifunctional polyol available from Olin Corp.; CB-60N is a polymeric toluene diisocyanate available from Bayer under the tradename Desmodur CB-60N; MRS-4 is a polymeric diphenyl-methane diisocyanate available from Bayer under the tradename Desmodur MRS-4; N-100 is a polymeric hexamethylene diisocyanate available from Bayer under the tradename Desmodur N-100; G-36-232 is a tri-hydroxy functional polyether-polyol available from Olin Chemical Col; BTBTO is bis(tributyltin) oxide available from Strem Chem Co.; TBT(OAc) is tributyltin acetate available from Strem Chem Co.; DBT(AA) is dibutyltin bis acetoacetate available from Strem Chem Co.; DBTDL is dibutyltin dilaurate available from Strem Chem Co.; TBTMA is tributyltin methacrylate; Aropol 2036 is a commercially available liquid resin consisting of styrene and an unsaturated polyester which is a mixture of isophthalic acid, a glycol, and maleic acid; CAT is cobalt (II) acetate tetrahydrate; DICY is dicyandiamide; Ex 1 is the spray-dried product of Example 1; similarly Ex 2, 3 and 4 are the spray-dried products of Examples 2, 3 and 4, respectively; 2×Viscosity is the time (in days unless otherwise noted) which the composition takes, at the indicated temperature, to double in viscosity. Gel times were measured using a Tecam 3 Gel Timer manufactured by Techne Instruments; a 75 g sample of the material was placed in a glass jar maintained at the indicated temperature with the phinger of the Gel Timer oscillating in the material. The gel time was the time in minutes taken to "trip" the timer.

In Example 1, a reaction mixture of C22A (180 g), IEMA (120 g), $CBr_4$ (10 g) and AIBN (3 g) in toluene (700 ml) was maintained at 80° C. for 16 hours under nitrogen, with stirring. Excess AMZ (107 g) toluene (350 ml) and THF (100 ml) were then added to the reaction mixture, and the mixture maintained at 40–50° C. with stirring for about 18 hours. After the mixture had cooled to room temperature, methanol (3 l) was added to it. The resulting precipitate was isolated by centrifuging, extraction with methanol, and drying at room temperature under reduced pressure. The product was a light yellow solid (290 g) containing no extractable AMZ by the detection method used (i.e. it contained less than 400 ppm free AMZ), and having an elemental analysis of C=63.97%, H=9.68% and N=9.33%. Thus the product was a polymer containing about 51% units derived from C22A, about 27% units derived from IEMA, and about 22% units derived from AMZ, and was obtained in a yield of about 73%. The initial values of $T_o$ and $\Delta H$, as reported in Table 1, could be increased substantially by annealing the product, e.g. by maintaining it at 40–45° C. for about 48 hours, or by increasing the temperature from 30 to 45° C. over about 25 hours. A sample of the product (20 g) was dissolved in 100 g of a 10:1 mixture of $CHCl_3$ and THF, and the solution was spray dried to yield particles of size less than 5 microns (0.05 mm).

In Example 2, substantially the same procedure as in Example 1 was followed, using the ingredients shown in Table 2.

In Example 3, a reaction mixture of C22A (75 g), DMAEA (25 g), AIBN (1 g), and C12SH (1 g) in toluene (200 ml) was maintained at 60° C. for 16 hours under nitrogen with stirring. The resulting polymer was precipitated by addition of ethanol, filtered, dried under reduced pressure, redissolved in $CHCl_3$, and spray dried. Substantially the same procedure was followed in Examples 4, 5A, 5B, 5C and 6, using the ingredients shown in Table 2.

In Example 7A, a monomer solution of C22A (58.61 g), C1M (8.60 g), MA (15.67 g) in toluene (67.12 g) was prepared at 50° C. under a nitrogen atmosphere and sparged with nitrogen for fifteen minutes. A stainless steel reactor was heated to 110° C. and sparged with nitrogen for 20 minutes. The monomer solution was added to the steel reactor over a period of 15 minutes, while at the same time TAP (0.60 g) was pumped into the reactor to initiate polymerization.

A 500 ml three-necked round bottom flask was equipped with a mechanical stirrer and a Dean-Stark water separator. The flask was charged with 36.3 g of the copolymer and 150 ml of toluene and heated to about 50° C. AMZ (8.76 g) was added dropwise to the copolymer solution. The reaction mixture was heated under reflux, distilling the toluene-water azeotrope, for about 18 hours. The reaction mixture was added slowly to one liter of ethyl alcohol to coagulate the polymer. The solid was collected by filtration, washed with ethyl alcohol and dried under vacuum at 50° C. for 16 hours. Elemental analysis showed 17% active imidazole. Poly (docosanyl acrylate-co-methyl methacrylate-co-N(ethyl-2-(1-methyl-(2-methyl)imidazolino))maleimide characteristics are provided in Table 1. The modifying agent was reduced in size to 5 micron average particle size using an air milling process.

In Example 7B, the same method was used as in Example 7A except that the addition of AMZ was performed below 50° C. with stirring for 2 hours to form the amic acid. Then the polymer was precipitated from methanol. The material was dried under reduced pressure.

In Example 8, the same copolymer consisting of C22A/C1M/MA was prepared. In this example the three-necked round bottom flask was charged with 17.3 g of the copolymer and 95 ml of toluene and heated to about 50° C. API (4.16 g) was added dropwise to the copolymer solution, and the reaction completed and the product recovered as in Example 7A. Elemental analysis showed 18% active imidazole. Poly(docosanyl acrylate-co-methyl methacrylate-co-N(propyl-3-(1-imidazolino))maleimide) characteristics are provided in Table 2. The modifying agent was reduced in size to 5 micron average particle size using an air milling process.

In Example 9, a solution of C22A (62 g), VDP (25 g), BPB (1.74 g) in 100 g toluene was prepared under a nitrogen atmosphere and charged into a 500 ml round bottom flask with a stirrer. The mixture was placed in a heating oil bath at 110° C., and stirred under nitrogen for 12 hours. The reaction mixture was added slowly to 1 liter of methyl alcohol with vigorous stirring to coagulate the polymer. The solid was collected by filtration, washed with 250 ml methyl alcohol, and dried under vacuum at 50° C. Elemental analysis showed 2.7% active phosphine. Poly(docosanyl acrylate-co-vinyldiphenyl phosphine) characteristics are provided in Table 2.

In Example 10, a solution of C22A (158 g), HEA (41.6 g), C12SH (8 g), AIBN (4 g) and 200 g toluene was charged into a 1 liter screw capped glass bottle containing a magnetic stirring bar and sparged with nitrogen for 20 minutes. The bottle was placed in a water bath and stirred for 20 hours at 60° C. The reaction mixture was added slowly to 1.5 liter of methyl alcohol with stirring to precipitate the polymer. The solid was collected, washed and dried as described in Example 9. A mixture of 150 g of the C22A/HEA polymer and 300 ml dry tetrahydrofuran was charged into a 500 ml round bottom flask under nitrogen atmosphere. The flask was immersed in a water bath to maintain the mixture at near room temperature. To the mixture was added via syringe 135 ml of 2.0 MLDA (Aldrich Chemical Co.). The mixture was stirred at room temperature for two hours. Then, 50 ml (59.5 g) CDP was added via syringe and the mixture stirred for 12 hours. A small amount of colorless solid was removed from the mixture by Buchner fitration. The filtrate was added slowly to 1 liter of methyl alcohol with stirring to precipitate the polymer. The solid was collected, washed and dried as described in Example 9. Elemental analysis showed 2.7% active phosphine. Poly(docosanyl acrylate-co-2-(diphenyl-phosphinoxy)ethyl acrylate) characteristics are provided in Table 2.

In Example 11, a solution of 50 g docosanyl acrylate, 50 g tri-n-butyltin methacrylate, 4 g dodecyl mercaptan, and 0.5 g AIBN was placed in a 1 liter glass reactor with a magnetic stirrer. The solution was sparged with nitrogen for 20 minutes. The reactor was sealed and was placed in a bath at 70° C. for 16 hours with stirring. The reaction was added slowly to 1.5 liters of acetone with vigorous stirring to precipitate the polymer. The solid was collected by filtration, washed with acetone, and dried under vacuum at approximately 50° C. for 12 hours. Elemental analysis indicated that the tin content was 14.9%. Poly(docosanyl acrylate-co-tri-n-butyltin methacrylate characteristics are provided in Table 1.

Table 2 shows ingredient quantities in grams, except as indicated otherwise. The compositions of the modifying agents are shown as % by weight.

TABLE 2

| Example | 1 | 2 | 3 | 4 | 5A | 5B | 5C | 6 | 7A&B | 8 | 9 | 10 | 11 |
|---|---|---|---|---|---|---|---|---|---|---|---|---|---|
| Ingredients | | | | | | | | | | | | | |
| C12A | — | — | — | — | 75 | 85 | 70 | — | — | — | — | — | 50 |
| C18A | — | — | — | — | — | — | — | 70 | — | — | — | — | — |
| C22A | 180 | 240 | 75 | 85 | — | — | — | — | 58.61 | 58.61 | 62 | 158 | — |
| C1M | — | — | — | — | — | — | — | — | 8.60 | 8.60 | — | — | — |
| MA | — | — | — | — | — | — | — | — | 15.67 | 15.67 | — | — | — |
| HEA | — | — | — | — | — | — | — | — | — | — | — | 41.6 | — |
| IEMA | 120 | 60 | — | — | — | — | — | — | — | — | — | — | — |
| DMAEA | — | — | 25 | 15 | 25 | 15 | 30 | 30 | — | — | — | — | — |
| AMZ | 107 | — | —* | — | — | — | — | — | 8.76 | — | — | — | — |
| API | — | — | — | — | — | — | — | — | — | 4.16 | — | — | — |
| LDA (2M) (ml) | — | — | — | — | — | — | — | — | — | — | — | 135 | — |
| CDP | — | — | — | — | — | — | — | — | — | — | — | 59.5 | — |
| VDP | — | — | — | — | — | — | — | — | — | — | 25 | — | — |
| TBT | — | — | — | — | — | — | — | — | — | — | — | — | 50 |
| TAP | — | — | — | — | — | — | — | — | 0.60 | 0.60 | 0.80 | — | — |
| BPB | — | — | — | — | — | — | — | — | — | — | 1.7 | — | — |
| AIBN | 3 | 3 | 1 | 1 | 1 | 1 | 1 | 1 | — | — | — | 4 | 0.5 |
| CBr$_4$ | 10 | 10 | — | — | — | — | — | — | — | — | — | — | 4 |
| C12SH | — | — | 1 | 1 | 1 | 1 | 1 | 1 | — | — | — | 8 | 4 |

TABLE 2-continued

| Example | 1 | 2 | 3 | 4 | 5A | 5B | 5C | 6 | 7A&B | 8 | 9 | 10 | 11 |
|---|---|---|---|---|---|---|---|---|---|---|---|---|---|
| Product | | | | | | | | | | | | | |
| % C22A | 51 | 71 | 75 | 85 | — | — | — | — | 57 | 57 | 62 | 56 | 50 |
| % C12A | — | — | — | — | 88 | 92 | — | — | — | — | — | — | — |
| % IEMA | 27 | 16 | — | — | — | — | — | — | — | — | — | — | — |
| % DMAEA | — | — | 25 | 15 | 12 | 8 | — | — | — | — | — | — | — |
| % C1M | — | — | — | — | — | — | — | — | 8.3 | 8.3 | — | — | — |
| % MA | — | — | — | — | — | — | — | — | 15.2 | 15.3. | — | — | — |
| % BPB | — | — | — | — | — | — | — | — | — | — | 17 | — | — |
| % HEA | — | — | — | — | — | — | — | — | — | — | — | 15 | — |
| % AMZ | 22 | 13 | — | — | — | — | — | — | 19.5 | — | — | — | — |
| % API | — | — | — | — | — | — | — | — | — | 19 | — | — | — |
| % VDP | — | — | — | — | — | — | — | — | — | — | 21 | — | — |
| % CDP | — | — | — | — | — | — | — | — | — | — | — | 29 | — |
| % TBT | — | — | — | — | — | — | — | — | — | — | — | — | 44 |
| $T_o$ (° C.) | 53 | 62 | 51 | 56 | −5 | −5 | — | — | 47 | 40.7 | 53.4 | 53.4 | 44 |
| $T_p$ (° C.) | 60 | 67 | 56 | 59 | 0 | 0 | 0 | 47 | 58 | 62.7 | 61.9 | 59.1 | 52 |
| ΔH (J/g) | 53 | 87 | 85 | 97 | 10 | 10 | — | — | 38 | 46 | 138 | 61.7 | 43 |
| $M_w$ (×1000) | 48.6 | 16. | 9.8 | 9.1 | 5.4 | 5.8 | 2.0 | 2.0 | 32.8 | 32.82 | 2.3 | 7.4 | 19 |
| $M_n$ (×1000) | 17.3 | 8.5 | 6.5 | 6.0 | 3.1 | 3.7 | — | — | 12.3 | 12.33 | 1.8 | 5.0 | 8.6 |

*an amount sufficient to give a product containing 13% AMZ.

Example 12

C18A (1925 g), C1M (412 g), AA (412 g), C12SH and butyl acetate (3 liters) were mixed. 20% of the mixture was placed in a reaction vessel and heated to 100° C. The remainder of the mixture was added to the reaction vessel over 90 minutes. The temperature was then raised to 110° C. and t-amylperoxy benzoate (13.8 g, Esperox 5100 available from Witco) was added, and heating continued for 90 minutes. The resulting polymer (POMA) was dried under reduced pressure and isolated. It had a $T_o$ of 35° C., a $T_p$ of 41° C., an $M_w$ of 85,000 and an $M_n$ of 15,800.

The POMA and 4,4'-dimethylamino benzophenone (Michler's ketone) were mixed in a solvent in a ratio corresponding to 1 equivalent of POMA carboxyl group to 0.5 equivalent of the ketone. The solvent was removed under vacuum, and the dried product formed into particles on an air mill, thus providing a modifying agent containing a photoactivatable group.

Example 13

Using the general procedure of Example 12, C18A, C1M, HEA and C12SH were reacted in a ratio of 70:10:20:1. The dried product (POMHA) had a $T_p$ of about 39° C. and an $M_w$ of about 8,700. The POMHA (100 g) was dissolved in tetrahydrofuran (500 ml) and cooled to 5° C. Butyl lithium (0.9 equivalents, based on hdyroxyl groups) is added in drops while maintaining the temperature below 10° C., followed by the addition in drops of 4-bromobenzophenone (1.2 equivalents). The mixture was stirred for 12 hours and filtered. The product (POMBP, a polymer containing attached benzophenone) was isolated by precipitation from ethanol and dried.

Example 14

C22A (1064 g) and C1M (156.4 g) were dissolved in xylene (1530 g). MA (570.7 g) was dissolved in xylene (719 g). The C22A/C1M solution was added to the MA solution over 1.5 hours at 1 10° C. and concurrently a solution of an initiator (30 g, Esperox 5100) in xylene (15 g) was metered in. The temperature was then increased to 130° C. After 2 hours, a further solution of an initiator (15 g, Esperox 5100) in xylene (7.5 g) was metered in. After 45 minutes, the temperature was reduced to 25° C. AMZ (727 g) was metered in over 1 hours. Xylene (2300 g) was then added, and the temperature increased to 130° C. After overnight heating to remove water of condensation, the polymeric modifying agent was precipitated with methanol.

Example 15

C22A (77 parts), vinyl imidazole (18 parts) and C12SH (5 parts) were reacted in xylene at 125° C. in the presence of an initiator (TAP, 1 part). After 2 hours, further initiator (0.5 part Esperox 5100) was added, and the reaction mixture was maintained overnight at 85° C. with stirring. At this point, the product could be isolated and formed into small particles. Alternatively, it could be mixed with an equal amount of epoxycylohexylmethyl-3,4-epoxy-cyclohexane carboxylate (ERL 4221) in a Cowles blender at less than 40° C. and then incubated overnight at 40° C. to provide a stable concentrate.

Example 16

A physically bound polymeric modifying agent was made as follows. Petrolite (100 g) was heated to 65° C. Ethanolamine (13 g) was then added. After increasing the temperature to 95° C., EMI (28.06 g) was added with stirring.

Example 17

A copolymer was prepared by heating C22A (75 g) DMAEA (25 g) and TAP (1%) at 110° C. The copolymer had an $M_w$ of 15,000–25,000 and a $T_p$ of 63° C. It was formed into particles having an average size of 10 microns.

Example 18

A copolymer of C22A, AA, and C12SH (96/3/1) having an $M_w$ of 80,000–100,000 was prepared. A mixture of this copolymer (70 parts) and DBU (30 parts) was prepared at 80° C., cooled and formed into particles having an average size less than 20 micron.

Example 19

To a heated (125° C.) vessel was added C22A (924 g), vinylimidazole (VI) (216 g), C12SH (60 g) along with 1% by weight Esperox 570. Over 90 minutes, an additional amount of C22A (3700 g), of VI (864 g) and C12SH (240 g) were added with 1% Esperox 570. The reaction proceeded for an hour followed by addition of 0.5% Esperox 5100 and further reaction for two hours. Dodecenyl succinic anhydride (4–12% by weight) was added to the hot reaction mixture. Then the reaction product was cooled, ground, and air milled to particles with a diameter of less than 10 microns.

Example 20

A reaction mixture of C22A (78.6 g), AA (19.6 g), C12SH (1.7 g) in toluene (100 ml) was sparged with nitrogen gas for 20 minutes, followed by addition of AIBN (1 g). The flask was sealed and placed in a thermostatted water bath, with stirring, at 60° C. for 20 hours. The reaction mixture was added slowly to 1 liter of acetone with vigorous agitation to precipitate the polymer. The polymer was collected by filtration and washed with acetone. The filtrate was dried in a vacuum oven at 50° C. for several hours. Analysis of the C22A/AA/C12SH polymer by gel permeation chromatography (GPC) indicated an $M_w$ of 23,083 and $M_w/M_n$=2.38.

In Example 20A, a solution of the C22A/AA/C12SH polymer (400 g in 800 ml toluene) was warmed with stirring to dissolve the polymer. To the solution was added 324.3 g of BTBTO. The reaction mixture was distilled using a Dean-Stark water separator. Water was collected to indicate progress of the reaction. When 10 g of water had been collected, the reaction mixture was added slowly to 3.2 liters of acetone with agitation to precipitate the polymer. The precipitate was collected by filtration, washed with acetone and dried in a vacuum oven at 50° C. for several hours. The product had a tin content of 13.1%, a $T_o$ of 37.01° C., a $T_p$ of 49° C., and a ΔH of 39.6 J/G. It was milled to yield particles with average size of less than 20 microns.

In Example 20B, a physically bound modifying agent was prepared by heating the C22A/AA/C12SH polymer (400 g in 800 ml toluene) and DBTDL (100 g) with stirring until a homogeneous mixture resulted. The mixture was cooled to room temperature, and milled into a fine powder.

Example 21

A solution of C22A (89.4 g), AA (6.7 g) and C12SH (3.8 g) in 100 g of toluene was sparged with nitrogen, and AIBN (0.1 g) was added. The mixture was heated at 60° C. for 24 hours, and cooled to about 40° C. 500 ml of methyl alcohol was added with vigorous stirring. The precipitate was collected by filtration, and was dried in a vacuum oven at 50° C. to 60° C. for 15 hours. Analysis by GPC showed the molecular weight ($M_w$) to be 100,000.

A solution of the polymer (175 g) in toluene (350 ml) was warmed to 50° C., and to it was added a solution of 40.7 g (0.163 mole) of cobalt (II) acetate tetrahydrate in 127 ml of warm water. The reaction mixture was heated under reflux for 4 hours to distill the toluene-water azeotrope into a trap, and then heated under reflux 14 hours. The hot reaction mixture was then added slowly to 2 L of acetone with vigorous agitation to precipitate the polymeric product. The precipitate was collected by filtration and dried in a vacuum oven at 60° C. overnight. Elemental analysis showed the cobalt level was 5.7 percent. The product was milled to a fine powder having a mean particle size of 4.2 microns.

Examples 22–31

Examples 22–31 show the preparation of modifying agents in which an active chemical ingredient is bonded physically, but not chemically, to the crystalline polymer.

The ingredients used in these Examples, and the amounts thereof, are shown in Table 3. In each Example, an SCC polymer of C22A and AA (in the proportions, and having $T_o$, $T_p$ and ΔH values, shown in Table 3) was mixed with the other ingredients shown in Table 3. In Examples 22–26 and 28–31, the resulting solution was heated and spray dried, using a Buchi laboratory spray drier under the conditions shown in Table 4 to yield particles of the size shown in Table 3. In Examples 21–24, the ingredients were simply mixed together before being spray dried. In Example 27, the SCC polymer (8 g) and Ancamine (25 g) were mixed at 92° C. to form an oil. The oil was emulsified by adding it to stirred water (150 g) which contained 1% polyvinyl alcohol (Mowiol 18-188) and was at 93° C. The mixture was sheared at 2500 rpm for 2 minutes, and then allowed to cool to room temperature while shearing at 1200 rpm. The resulting microcapsules of solidified oil had a particle size of about 30 microns and were collected by filtration. After washing with deionized water, the particles were dried in air for several days; they contained about 55% Ancamine and had a $T_o$ of 47° C., a $T_p$ of 50° C. and a ΔH of 45 J/G. When the product was collected by centriguation instead of filtration, it contained about 27% Ancamine.

In Example 28, the SCC polymer was melt blended with the DABCO, then dissolved in the chloroform and spray dried. In Example 29, the ingredients were mixed and spray dried at 64° C. In Examples 30 and 31, 2EZ or AMI-2 was dissolved in water and spray dried to yield a fine powder. This fine powder (10 g) was mixed with the SCC polymer (10 g) and heptane (180 ml) at 80° C., and the suspension spray dried to yield a powder in which the particles comprise the 2EZ or AMI-2 surrounded by a coating of the SCC polymer.

TABLE 3

| Ex. No. | 22 | 23 | 24 | 25 | 26 | 27 | 28 | 29 | 30 | 31 |
|---|---|---|---|---|---|---|---|---|---|---|
| C22A | 99 | 95 | 85 | 75 | 95 | 95 | 93 | 99 | 95 | 95 |
| AA | 1 | 5 | 15 | 25 | 5 | 5 | 7 | 1 | 5 | 5 |
| To (° C.) | 59 | 59 | 60 | 57 | 59 | 59 | — | — | 59 | 59 |
| Tp (° C.) | 62 | 63 | 64 | 64 | 62 | 63 | 65 | — | 63 | 63 |
| ΔH (J/g) | 80 | 74 | 59 | 57 | 80 | 74 | — | — | 74 | 74 |
| SCC | 45 | 45 | 45 | 45 | 30 | 8 | 99.4 | — | 10 | 10 |
| EMI | 15 | 15 | 15 | 15 | 30 | — | — | — | — | — |
| Chloroform | 380 | 380 | 380 | 380 | 120 | — | 235 | 105 | — | — |
| Ancamine | — | — | — | — | — | 25 | — | — | — | — |
| DABCO | — | — | — | — | — | — | 32 | — | — | — |
| 2 EZ | — | — | — | — | — | — | — | 12.5 | 10 | — |

TABLE 3-continued

| Ex. No. | 22 | 23 | 24 | 25 | 26 | 27 | 28 | 29 | 30 | 31 |
|---|---|---|---|---|---|---|---|---|---|---|
| Heptane | — | — | — | — | — | — | — | — | 180 | 180 |
| AMI2 | | | | | | | | | | 10 |
| Size (micron) | 8 | 12 | 9 | 9 | — | 30 | — | — | — | — |

TABLE 4

| | Example No. | | | | |
|---|---|---|---|---|---|
| | 22–25 | 26 | 27 | 29 & 30 | 31 |
| Feed Pump Setting (ml/min) | 3.5 | 2.3 | 2.3 | 2 | 4 |
| Aspirator Setting (ft³/min) | 10 | 7 | 4 | 4 | 11 |
| Nozzle Orifice Size (min) | 0.5 | 0.7 | 0.7 | 0.7 | 0.7 |
| Inlet Temperature (° C.) | 51 | 54 | 41 | 54 | 62 |
| Outlet Temperature (° C.) | 32 | 41 | 38 | 40 | 52 |
| Atomizing Air (cc/mm) | 850 | 720 | 720 | 725 | 800 |

Examples A to Z

In Examples A to Z, some of the modifying agents prepared in Examples 1 to 31 were used to prepare crosslinked polymeric resins. For Examples A to J, the ingredients used, and the properties of the resulting products, are summarized in Table 5, in which the DSC data is obtained by heating from 30° C. to 300° C. at 10° C./minute.

In Example A, the modifying agent of Example 2 (containing C22A, IEMA and AMZ, 13%) was hand mixed with DGEBA to give 5 parts of AMZ per hundred parts of DGEBA. When heated at 90°, 100° and 110° C., the composition reached the isogel point in less than 7.5, less than 5, and less than 2.5, minutes respectively. When heated from 30° to 120° C. at a heating rate of 10° C. per minute on a Rheometrics mechanical spectrometer, the composition reached an elastic modulus of more than $10^7$ dyn/cm² and a viscous modulus of more than $10^6$ dyn/cm² within 15 minutes.

In Example B, the procedure of Example A was followed except that the modifying agent of Example 2 was replaced by the modifying agent of Example 1 (containing C22A, IEMA and AMZ, 22%) was used to give 3 parts of AMZ per 100 parts of DGEBA. When heated on a mechanical spectrometer as in Example A, the results were as in Example A.

In Example C, which is a comparative example, DGEBA was mixed with AMZ (5 parts per hundred).

In Examples D and E, DGEBA was mixed with the modifying agents of Examples 3 and 4, respectively.

In Examples F, G and H, which are comparative examples, Pluracol (21 g) and Isonate (5 g) were mixed together, and to the mixture was added (i) in Example F, nothing, (ii) in Example G, 1.6 g of DABCO 33LV, and (iii) in Example H, 4 g of a spray-dried mixture of a copolymer of C22A and AA (85/15), 67 g, and DABCO 33LV, 46 g, so that the mixture contains 13.4% DABCO.

In Example IA, 15 parts of the modifying agent of Example 7A, corresponding to 2.6 parts AMZ, were mixed with 100 parts of Epon 828 epoxy resin. In Example IB, an anhydride-containing epoxy resin system was prepared from 5.9 g of the modifying agent of Example 7A, 102 g Epon 828 and 80 g methyltetra-hydrophthalic anhydride (MeTHPA). In Example IC, which is a comparative example, a similar system, except that the catalyst was not modified, was prepared from 100 g Epon 828, 80 g MeTHPA. and 1 g AMZ. The systems of Examples IB and IC cured to hard thermoset plastics on heating. The system of Example IB did not double in viscosity for at least four days at 40° C., whereas the system of Example IC was a hard glass in less than one day. In Example ID, the procedure of Example IB was followed, except that the modifying agent was premixed with the MeTHPA prior to mixing with Epon 828. The cured resin had improved clarity.

In Example IE, the modifying agent of Example 7B was used instead of the modifying agent of Example 7A in the procedures of Examples IA, IB and ID. The modifying agent of Example 7B was wetted more rapidly by the matrix, and as a result yielded higher quality cured resins when storage periods were short. This may be attributed to the carboxyl groups which are present in the amic acid structure in the modifying agent of Example 7B but are not present in the maleimide structure in the ring-closed modifying agent of Example 7A.

In Example J, the modifying agent of Example 8 (6.2 parts, corresponding to 1.1 parts of API) was mixed with 100 parts of Epon 828 and maintained at 40° C. for 43 hours to test the latency of the polymer bound catalyst for use in curing. A similar formulation of 15 parts of C22A/C1M/MA-API in 100 parts of Epon 828 exhibited an increase in viscosity of less than 100% after storage at 40° C. for 3 months.

TABLE 5

| EXAMPLE | A | B | C* | D | E | F* | G* | H* | I | J |
|---|---|---|---|---|---|---|---|---|---|---|
| Ingredients | | | | | | | | | | |
| DGEBA | Yes | Yes | Yes | Yes | Yes | — | — | — | | |
| Epon 828 | — | — | — | — | — | — | — | — | Yes | Yes |
| Pluracol | — | — | — | — | — | 21 | 21 | 21 | — | — |
| Isonate | — | — | — | — | — | 5 | 5 | 5 | — | — |
| Ex 1 | — | Yes | — | — | — | — | — | — | — | — |
| Ex 2 | Yes | — | — | — | — | — | — | — | — | — |
| Ex 3 | — | — | — | Yes | — | — | — | — | — | — |

TABLE 5-continued

| EXAMPLE | A | B | C* | D | E | F* | G* | H* | I | J |
|---|---|---|---|---|---|---|---|---|---|---|
| Ex 4 | — | — | — | — | Yes | — | — | — | — | — |
| Ex 7 | — | — | — | — | — | — | — | — | Yes | — |
| Ex 8 | — | — | — | — | — | — | — | — | — | Yes |
| AMZ | — | — | Yes | — | — | — | — | — | — | — |
| API | — | — | — | — | — | — | — | — | — | — |
| DABCO 33LV | — | — | — | — | — | — | 1.6 | — | — | — |
| C22A/AA/DABCO | — | — | — | — | — | — | — | 4 | — | — |
| AMZ (phr) | 5 | 3 | 5 | — | — | — | — | — | 2.6 | — |
| API (phr) | — | — | — | — | — | — | — | — | — | 2.7 |
| DMAEA (phr) | — | — | — | 5 | 5 | — | — | — | — | — |
| 2 × Viscosity (days) | | | | | | | | | | |
| at 25° C. | >120 | >120 | <2 | >120 | >120 | >1 min | <1 min | 20 min | — | — |
| at 40° C. | >60 | >60 | — | >14 | >14 | — | — | — | >360 | >360 |
| DSC data | | | | | | | | | | |
| Onset (° C.) $T_o$ | 132 | 114 | 99 | 135 | 150 | — | — | — | 135 | 136 |
| Peak (° C.) $T_p$ | 146 | 137 | 130 | 200 | 195 | — | — | — | 151 | 153 |
| Heat of Reaction (J/g) | 350 | 350 | 580 | 75 | 50 | — | — | — | 385 | 229 |

*Comparative example

Example K

In Examples KA, KB, KC and KD, DGEBA was mixed with equivalent amounts of a tertiary amine reactant as specified below, and the mixture was used to bond together two aluminum strips 3×0.5×0.125 inch overlapped by 0.5 inch, the mixture being cured at 95–100° C. for 16 hours. The lap shear strength of the bond was measured using an Instron Load Cell at 25° C. and at a rate of 0.05 inch/min. The tertiary amine reactants and the lap shear strengths are shown in Table 6 below, and demonstrate the toughening effect of the SCC polymer component.

TABLE 6

| | Reactant | Amount (phr) | Equivalent Weight | Lap Shear Strength |
|---|---|---|---|---|
| KA | Triethylamine | 7.9 | 101 | 1000 |
| KB | Ancamine K54 | 5.9 | 89 | 1000 |
| KC | Example 6 (C18A, DMAEA) | 37 | 477 | 2000 |
| KD | Example 5C (C12A, DMAEA) | 37 | 477 | 2000 |

Example L

A curable pressure-sensitive ahesive was prepared by mixing 75 parts of a low $T_g$ polymer (C16A/EHA/AA; 30:63:7, $M_w$=21,400 and $M_w/M_n$=2) with 24 parts of a crystalline polymer (C22A/GMA 80:20, $M_w$=17,400 and $M_w/M_n$=1.7, and $T_m$=63° C.). The mixture was briefly heated to 80° C., stirred, and then quickly cooled to 25° C., thus forming a dispersion of particles of the crystalline polymer in the low Tg polymer. To the paste obtained in this way was added one part tris(dimethyl-aminomethyl)phenol (K54 from Air Products). The formulation was shown to be stable by DSC and viscosity for greater than 60 days at 25° C. The system was shown to be greater than 100 times more stable at 50° C. than predicted by Arrhenius kinetics from cure at 90, 110 and 130° C.

Example M

An SCC polymer, C18A/AA (95/5 wt %), was formed into microspheres having a median size of 33 microns, with 90% having a size less than 50 microns. Titration of a suspension of the microspheres in a poor solvent for the polymer (ethanol) yielded no detectable carboxyl functionality, while titration of a suspension in a good solvent (THF) yielded 4.75 wt % carboxyl. This demonstrates that the SCC polymer moiety, so long as it is solid, shields the carboxyl groups from the surrounding medium. A suspension of the microspheres in a 30/70 mixture of THF/ethanol was titrated first at a temperature below the polymer melt temperature, when no carboxyl groups were detected, and then at a temperature above the polymer melt temperature, when 4.6% carboxyl groups were detected.

Example N

A cured composite was prepared using a graphite cloth supplied by Stackpole Fibers, Inc. of Lowell, Mass. (PANEX high modulus, high strength carbon fiber reinforcement #CFP30-05). The cloth was impregnated with the latent epoxy (SCC/tertiary amine) mixture prepared in Example B. The cloth was heated to 100° C. by passing DC current through it, thus curing the resin to yield an amber-colored composite product.

Example O

Two curable mixtures (A) and (B) were prepared by mixing at 25° C. (A) 13.7 g of liquid EPON 828 with 0.7 g of liquid EMI-24 and (B) 9.2 g of EPON 828 with 0.92 g of 5 micron spherical particles, the spherical particles consisting of a 50:50 mixture of EMI-24 and SCC polymer (C22A/AA; 95/5). Mixture A, containing free EMI-24, increased in viscosity at 25° C. from 76 to 4132 poise in 24 hours, while Mixture B, containing the thermally triggered particles, exhibited an increase in viscosity at 25° C. from 146 to 650 poise in 24 hours.

Example P

A curable mixture was prepared by mixing 50 g of polybutyl methacrylate supplied by Aldrich Chemical Company, 20 g of tripropyleneglycol diacrylate, 22 g of octyl acrylate, 1 g of benzoyl peroxide and 7 g of C22A/DMAEA polymer from Example 3. The mixture was storage stable for one week at ambient temperature and cured to a crosslinked mixture in one hour at 70° C.

Example Q

POMA (20 parts, prepared in Example 12), C1M (50 parts), MA (10 parts), TPGDA (20 parts) were combined at 50° C. in the absence of light and then cooled to room temperature. The resin produced (10 parts) was dissolved in toluene (20 ml), coated onto a polyester film at a dry film thickness of 48 microns and subsequently covered with a 38 micron film of polyethylene, to produce a laminatable photoresist which could be activated by heat and light.

Example R

A mixture consisting of 3 g RF713 (conductive silver epoxy resin from Resin Formulators Division of EV Roberts, Inc.) and 0.16 g of the modifying agent prepared in Example 7 was prepared. A second mixture consisting of 3 g RF713 and 0.03 g of 2-ethyl-4-methylimidazole (EMI-24 available from Air Products) was prepared. Each mixture was heated in a hot press between aluminum plates at 177° C. and disks were formed 6.6 mm in diameter and 3.1 mm in thickness. Each of the disks had a resistance of about 5 ohms.

Example S

Example S shows how the addition of a co-additive to a modifying agent/resin mixture can reduce the time required for the modifying agent to effectively wet the resin. A mixture of 13.6 g of the modifying agent of Example 1, 4% by weight of W-990 based on the weight of the modifying agent, and 100 g of Epon 828 epoxy resin was prepared. The modifying agent was wetted by the resin in 4 days at 40° C., as indicated by the uniformly glossy cured coating which could be obtained from the mixture at this time. In the absence of the wetting agent, a similar cured product could not be obtained unless the modifying agent had been wetted by the resin for 3 months at 40° C.

Example T

Example T shows how the addition of a co-additive can improve the aesthetic and mechanical characterisitics of a thermoset resin. The system of example I was evaluated with and without nonyl phenol. 14 parts nonyl phenol yielded glossy, clear thermosets at 80° C. Curing at 120° C. required less than 3 parts of nonyl phenol to achieve the same high gloss, clear, uniform thermosets. Without nonyl phenol the system cured to a flat finish at 120° C.; between 80–120° C. the system cured to a phase separated thermoset that had poor gloss and poor clarity.

Example U

The modifying agent of Example 8 (5.9 parts) and methyltetrahydrophthalic anhydride (MeTHPA) (80 parts) were shaken together in ajar. Epon 828 (100 parts) was added, and the mixture mixed in a Cowles mixer for 5 minutes at 3000 rpm, and allowed to stand overnight at 40° C. The viscosity of the resulting product was 6 poise initially, less than 30 poise after 3 weeks, and greater than 600 poise after 2 months. The product was then cured at 120° C. for 60 minutes. After 20–40 minutes it had a modulus greater than $10^7$ dyne/cm$^2$. The final product exhibited good appearance.

Example V

The modifying agents of Examples 17 and 18 were compared with each other and with the unmodified DBU catalyst, in experiments in which they were added to a polyurethane precursor containing D8 (70 parts), Pluracol (30 parts) and MRS4 (38 parts) in an amount equivalent to about 0.3 parts of DBU or 0.3 part DMAEA per 100 parts of polyol. The pot life in minutes at 25° C., measured on 25 ml samples, and the gel time in minutes, measured on 5 g samples on a hot plate, are given in Table 7 below.

TABLE 7

|  | Ex 17 | Ex 18 | DBU |
| --- | --- | --- | --- |
| DMAEA | 0.31 | — | — |
| DBU (phr) | — | 0.30 | 0.30 |
| Pot life (mins) 25° C. | >60 | 30 | 0.25 |
| Gel time (mins) 80° C.) | 10 | 2 | 0 |

Example W

A physically bound modifying agent containing 26% DBTDL was prepared as in Example 18 but replacing the DBU by DBTDL. This modifying agent and DBTDL itself were used with various isocyanate/polyol combinations, in amount such that the mixture contained 0.5 phr of DBTDL versus polyol.

The ingredients used and the amounts of the isocyanates and polyols (in parentheses), and the results obtained, are shown in Table 8 below, in which Mod Ag refers to the DBTDL-containing modifying agent.

TABLE 8

| Ex. No. | Ingredients | Pot Life | Gel Time |
| --- | --- | --- | --- |
| W1 | D1150/CD-60N (100/119)/DBTDL | >60 | 9 |
| W2 | D1150/CB-60N (100/119)/Mod Ag | >60 | 9 |
| W3 | D800/CB-60N (100/209)/DBTDL | >60 | 4:20 |
| W4 | D800/CB-60N (100/209)/Mod Ag | >60 | 3:20 |
| W5 | Pluracol/G36-232/CB-60N (80/20/90)/DBTDL | >60 | 7 |
| W6 | D800/MRS-4 (100/67)/Mod Ag | >60 | 5:20 |
| W7 | D1150/MRS-4 (100/38)/DBTDL | 3:15 | 1:20 |
| W8 | D1150/MRS-4 (100/38)/Mod Ag | 4:40 | 1:40 |
| W9 | D800/MRS-4 (100/67)/DBTDL | 3 | 00:30 |
| W10 | D800/MRS-4 (100/67)/Mod Ag | 40 | 00:30 |
| W11 | Pluracol/G36-232/MRS-4 (80/20/29)/DBTDL | 7:45 | 2:20 |
| W12 | Pluracol/G36-232/MRS-4 (80/20/29)/Mod Ag | 14:20 | 2:20 |
| W13 | D1150/Isonate (100/37)/DBTDL | 3:15 | 1:10 |
| W14 | D1150/Isonate (100/37)/Mod Ag | 7:15 | 1:10 |
| W15 | D800/Isonate (100/65)/DBTDL | 00:30 | 00:00 |
| W16 | D800/lsonate (100/65)/Mod Ag | 5 | 00:30 |
| W17 | Pluracol/G36-232/Isonate (80/20/28)/DBTDL | 5:30 | 1:15 |
| W18 | PluracoI/G36-232/Isonate (80/20/28)/Mod Ag | 8 | 1:25 |
| W19 | D800/N-100 (100/99)/DBTDL | 8 | 2 |
| W20 | D800/N-100 (100/99)/Mod Ag | >60 | 1:30 |

Example X

Various modifying agents identical or similar to the modifying agent of Example 20 (i.e. agents prepared from different monomers and/or monomer ratios and/or different tin chelates) were mixed with a premixed mixture of Pluracol (64 phr), Isonate (20 phr) and G-36-232 (16 phr) to give 0.1 phr of tin. The resulting systems were tested for reactivity at different temperatures by monitoring the gel time. Table 9 below shows the results. Examples X1–X3 serve as controls. Examples X4–X7 use modifying agents with tin covalently bound to the polymeric moiety. Examples X8–X12 use modifying agents in which the tin is physically, but not chemically, bound to the crystalline polymer. Gel times at 20° C. are slowest when the tin is covalently bound, but are still substantially slower than the control when the tin is physically bound. Other things being equal, the higher the ratio of AA to tin the longer, the higher the gel time at 20° C. and the lower the gel time at 80° C.

TABLE 9

| Ex. | Catalyst | AA/Tin | % Tin in Catalyst | Gel Time at 20° C. | Gel Time at 80° C. | Gel Time at 100° C. | Gel Time at 120° C. |
|---|---|---|---|---|---|---|---|
| X1 | TBT(OAc) | 0 | 34 | — | 30 | 6 | 3 |
| X2 | DBTDL | 0 | 19 | 14 | 2 | <2 | <2 |
| X3 | DBT(AA) | 0 | 27 | — | <2 | <2 | <1.5 |
| X4 | TBT(OAc)/C22A/AA/C12SH (89/6.7/3.8) | 0.43 | 15 | >1400 | 20 | 15 | 15 |
| X5 | C22A/TBTMA | 0 | 15 | >1400 | 34 | 13 | 7 |
| X6 | BTBTO/C22A/AA/C12SH (89/6.7/3.8) | — | 10 | >1600 | 50 | 20 | 9 |
| X7 | BTBTO/C22A/HEA/C12SH (76.7/20.8/2.5) | — | 6 | — | 21 | 9 | 4 |
| X8 | DBT(AA)/C22A/AA/C12SH (94/1/5) | 0.27 | 5 | 60 | 2.25 | 1.25 | 1 |
| X9 | DBTDL/C22A/AA/C12SH (86.5/9.6/3.9) | 4.13 | 5 | — | >180 | >180 | >180 |
| X10 | DBT(AA)/C22A/AA/C12SH (86.5/9.6/3.9) | 2.58 | 5 | >1400 | >120 | >120 | >120 |
| X11 | DBTDL/C22A/AA/C12SH (93.2/2/3.8) | 0.8 | 4.5 | 30 | 15 | 8 | 3 |
| X12 | DBTDDL/C22A/AA/C12SH (93.2/2/3.8) | 2.1 | 3.1 | 55 | 130 | 60 | 60 |

Example Y

The modifying agent of Example 21 was used to cure a mixture of 100 g of Aropol 2036 unsaturated polyester resin and 1.25 g of methylethyl ketone peroxide (MEKP). 0.67 g of the modifying agent and the mixture were vigorously stirred for 5 min by hand to disperse the modifying agent. The gel time of the system at 20° C. was 223 min. A control mixture of Aropol 2036 (100 g), MEKP (1.25 g) and 0.6 g of a solution of cobalt napthenate in mineral spirits (containing 6% elemental cobalt) had a gel time of 16 min.

Other cobalt catalysts and other cobalt catalyst-containing modifying agents were used to cure the same mixture of Aropol 2036 (100 g) and MEKP (1.25 g). All the cured systems reached a modulus of more than $10^7$ dyn/cm$^2$ when measured at 30° C. and 120° C., and had a $T_g$ of 120° C.–125° C. Details of the catalysts, showing the cobalt content and the molecular weight of the crystalline polymer ingredient, and the results obtained, are shown in Table 10 below.

TABLE 10

| Example | Catalyst (% elemental cobalt) | g | $M_w$ | Gel time at 20° C. |
|---|---|---|---|---|
| *Y1 | — | 0 | — | 8237 |
| *Y2 | Co(II)naphthenate in mineral spirits (6%) | 0.6 | — | 16 |
| *Y3 | Co(II) stearate (9.52%) | 0.39 | — | 38 |
| *Y4 | Co(II) octoate (20.5%) | 0.19 | — | 12 |
| Y5 | 6% Co(II) stearate in C22A/AA/C12SH (93/7/4) (6%) | 0.6 | — | 54 |
| Y6 | 3.5% Co(II) stearate in C22A/AA/C12SH (93/7/4) (3.5%) | 1.0 | — | 255 |
| Y7 | Co(II)-C22A/AA/C12SH (93/7/4) (4.1%) | 0.88 | 50000 | 735 |
| Y8 | Co(II)-C22A/AA/C12SH (93/7/4) (5.4%) | 0.67 | 11185 | 562 |
| Y9 | Co(II)-C22A/AA/C12SH (93/7/4) (14%) | 0.26 | 23000 | 198 |
| Y10 | Co(II)-C22A/AA/C12SH (80/20/1.5) (5.4%) | 0.67 | 11185 | 223 |
| Y11 | Co(II)-C22A/AA/C12SH (82.8/7.2/10) (5.6%) | 0.64 | 3929 | 120 |
| Y12 | Co(II)-C22A/AA/C12SH (93/7/4) (5.6%) | 0.6 | 20046 | 567 |
| Y13 | Co(II)-C22A/AA/C12SH (72/18/10) (13%) | 0.28 | 3450 | 1025 |
| Y14 | Co(II)-C22A/AA/C12SH (72/18/10) (0.5%) | 7.2 | 23000 | 874 |
| Y15 | Co(II)-C22A/AA/C12SH (78.8/19.7/1.5) (2%) | 1.8 | 23000 | 1029 |

Examples Y1–Y4 are comparative examples. In the modifying agents in Examples Y5 and Y6, the cobalt catalyst is physically, but not chemically, bound to the polymeric ingredient. In other Examples, the cobalt catalyst is chemically bound to the polymeric ingredient.

Example Z

The physically bound modifying agents of Examples 22–31, and the active chemical ingredients on their own (for comparative purposes) were mixed with various matrix materials, as set out in Tables 12–14 below, and then tested, with the results shown in Table 13 below. In Tables 12–14, the entry "phr amine" shows the active amine concentration in the mixture.

In Examples Z1–Z4, a 20 ml vial of the modifying agent (1.2 g) and Epon 828 (10 g) were placed in a 20 ml vial and mixed vigorously with a spatula. As in Examples A to J, the samples were tested on a DSC at a heating rate of 10° C./min from 30° to 300° C. In Examples Z5–Z6, the modifying agent or EMI-24 was hand mixed with the epoxy resin. DSC data were obtained in the same way. Viscosity was measured initially and after 2 days. Lap shear values were obtained by spreading the mixture on 1 x 0.5 inch aluminum coupons with 0.5 inch overlap, heating the sample at 120° C., and measuring the lap shear strength on an Instron Tensile tester with a 1000 lb. load cell at 0.05 inch/min. after the times indicated. The viscosity profiles of the samples over time (rheometer, time sweep, 70° C., 25 rad/sec 20% strain) are shown in Table 11 below.

TABLE 11

| Viscosity after (mins) | 0 | 10 | 20 | 30 | 40 | 50 | 55 |
|---|---|---|---|---|---|---|---|
| Ex Z5* | 1.5 | 1.5 | 3 | 5 | 12 | 51 | 188 |
| Ex Z6 | 2 | 3 | 4 | 5 | 9 | 21 | 40 |

| Viscosity after (mins) | 60 | 63 | 66 | 69 | 72 | 75 | 78 |
|---|---|---|---|---|---|---|---|
| Ex Z5* | 1327 | 5379 | 15930 | 46160 | 74940 | 83080 | 76660 |
| Ex Z6 | 102 | 220 | 580 | 1861 | 7263 | 31580 | 126000 |

*Comparative Example

In Examples Z7–Z10, the ingredients were mixed by hand. In Examples Z11 and Z12, the ingredients were mixed in amounts such that the NCO:OH ratio was 1:1. In Examples Z13–Z17, the ingredients were mixed by hand, and the results of DSC testing are given in Table 15 as the residual heat of reaction, expressed as a percentage of the initial heat of reaction (which was 300–350 J/g in Examples Z13–Z15 and 400–600 J/g in Examples Z16–Z17).

TABLE 12

| Ex No | Z1 | Z2 | Z3 | Z4 | Z5* | Z6 |
|---|---|---|---|---|---|---|
| Mod Agent of Example | Ex 22 | Ex 23 | Ex 24 | Ex 25 | — | Ex 26 |
| EM I 24 | — | — | — | — | Yes | — |
| phr amine | 3 | 3 | 3 | 3 | 5 | 5 |
| Epon 828 | 10 | 10 | 10 | 10 | 85 | 85 |
| Kelpoxy | — | — | — | — | 25 | 25 |

TABLE 13

| Ex No | Z7* | Z8 | Z9* | Z10 | Z11* | Z12 |
|---|---|---|---|---|---|---|
| Mod Agent of Example | — | Ex 27 | — | Ex 28 | — | Ex 28 |
| Ancamine | Yes | — | — | — | — | — |
| DABCO 33LV | — | — | Yes | — | Yes | — |
| phr amine | 5 | 5 | 5 | 5 | 2 | 2 |
| Epon 828 | 100 | 100 | 100 | 100 | — | — |
| Olin | — | — | — | — | Yes | Yes |
| Isonate | — | — | — | — | Yes | Yes |

TABLE 14

| Ex No | Z13* | Z14 | Z15 | Z16* | Z17 |
|---|---|---|---|---|---|
| Mod Agent of Example | — | Ex 29 | Ex 30 | — | Ex 31 |
| 2EZ | Yes | — | — | — | — |
| AMI | — | — | — | Yes | — |
| phr amine | 5 | 5 | 5 | 5 | 5 |
| Epon 828 | 10 | 10 | 10 | 10 | 10 |

TABLE 15

| Example No. | Z1 | Z2 | Z3 | Z4 | Z5* | Z6 |
|---|---|---|---|---|---|---|
| $T_o$ (° C.) | | 123 | 124 | 128 | 133 | 116 | 112 |
| $T_p$ (° C.) | | 134 | 136 | 139 | 144 | 126 | 128 |
| $\Delta H_f$ (J/g) | | 244 | 276 | 218 | 222 | 464 | 480 |

TABLE 15-continued

| Viscosity (poise) 20° C. | | | | | | |
|---|---|---|---|---|---|---|
| initial | — | — | — | — | 76 | 147 |
| after 1 day | — | — | — | — | 4132 | 650 |
| after 8 days | solid | solid | solid | solid | — | — |
| Lap Shear (psi) | | | | | | |
| after 1 hour | — | — | — | — | 1960 | 1870 |
| after 3.5 hours | — | — | — | — | 1950 | 1747 |

| Example No. | Z7* | Z8 | Z9* | Z10 | Z11* | Z12 |
|---|---|---|---|---|---|---|
| $T_o$ (° C.) | 105 | 100 | — | — | — | — |
| $T_p$ (° C.) | 122 | 115 | — | — | — | — |
| $\Delta H_f$ (J/g) | 84 | 91 | — | — | — | — |
| Viscosity (poise) | | | | | | |
| initial | x | y | p | q | — | — |
| after 2 hours | — | — | 200p | — | — | — |
| after 1 day | 5 x | y | solid | 28 q | — | — |
| after 2 days | Solid | — | — | — | — | — |
| after 5 days | — | 10 y | — | — | — | — |
| Gel Time (min) | — | — | — | — | 0.1 | 20 |

| Example No. | Z13* | Z14 | Z15 | Z16* | Z17 |
|---|---|---|---|---|---|
| % original enthalpy | | | | | |
| after 1 day | 85 | 92 | 100 | 71 | 87 |
| after 2 days | 60 | 82 | 89 | — | — |
| after 3 days | — | 82 | — | 46 | 73 |
| after 4 days | 65 | — | 69 | — | — |

What is claimed is:

1. A composition which comprises
   (1) a matrix material; and
   (2) a modifying agent which
      (a) comprises
         (i) a polymeric moiety which comprises a crystalline polymeric moiety having an onset of melting temperature $T_o$ and a peak melting temperature $T_p$ such that $T_p-T_o$ is less than $T_p^{0.7}$; and
         (ii) a catalytic moiety which, when in contact with the matrix material at an elevated temperature, catalyzes a chemical reaction of the matrix material, and
      (b) is in the form of solid particles which
         (i) have some of the active chemical moieties on the surface of the particles and the other active chemical moieties hidden within the particles,
         (ii) are distributed in the matrix material,
         (iii) have an average particle size of less than 150 micron, and
         (iv) when heated above $T_p$, undergo a physical change which (A) substantially increases the extent to which the matrix material is contacted by the catalytic moiety and (B) causes the chemical reaction of the matrix material to take place.

2. A composition according to claim 1 which also contains a coadditive which contains
   (i) one or more non-polar groups which are alkyl, fluoroalkyl or alkyl styrene groups in which the alkyl groups contain at least 6 carbon atoms, and
   (ii) one or more polar groups which are epoxy, hydroxyl, carboxyl, amino, ammonium, ether, ester, amide, sulfonamide, sulfonic acid, sulfonic acid salt or phosphate groups.

3. A composition according to claim 1 wherein the modifying agent contains polar groups and the matrix material contains polar groups.

4. A composition according to claim 1 wherein
   (a) the matrix material comprises precursors for a thermoset polymer; and
   (b) the catalytic moiety is a catalyst for reaction of said precursors to form the thermoset polymer.

5. A composition according to claim 4 wherein the crystalline polymer in the polymeric moiety comprises a side chain crystalline polymer.

6. A composition according to claim 1 wherein
   (a) the matrix material comprises an unsaturated polyester which will undergo a crosslinking reaction when exposed to a metal-containing catalyst; and
   (b) the catalytic moiety is a metal-containing compound which is a catalyst for said crosslinking reaction.

7. A composition according to claim 6 wherein the crystalline polymer in the polymeric moiety comprises a side chain crystalline polymer.

8. A composition according to claim 1 wherein
   (a) the matrix material comprises a vinyl ester which will undergo a crosslinking reaction when exposed to a metal-containing catalyst; and
   (b) the catalytic moiety is a metal-containing compound which is a catalyst for said crosslinking reaction.

9. A composition according to claim 8 wherein the crystalline polymer in the polymeric moiety comprises a side chain crystalline polymer.

10. A composition according to claim 1 wherein
    (a) the matrix material comprises chemical compounds which will undergo reaction together when exposed to a metal-containing catalyst to form a polyurethane; and
    (b) the catalytic moiety is a metal-containing compound which is a catalyst for said reaction.

11. A composition according to claim 10 wherein the crystalline polymer in the polymeric moiety comprises a side chain crystalline polymer.

12. A composition according to claim 1 wherein
    (a) the matrix material comprises chemical compounds which will undergo reaction together when exposed to a metal-containing catalyst to form a polyurea; and
    (b) the catalytic moiety is a metal-containing compound which is a catalyst for said reaction.

13. A composition according to claim 12 wherein the crystalline polymer in the polymeric moiety comprises a side chain crystalline polymer.

14. A composition according to claim 1 wherein
    (a) the matrix material comprises chemical compounds which will undergo reaction together when exposed to a metal-containing catalyst to form a polyisocyanurate; and
    (b) the catalytic moiety is a metal-containing compound which is a catalyst for said reaction.

15. A composition according to claim 14 wherein the crystalline polymer in the polymeric moiety comprises a side chain crystalline polymer.

16. A composition according to claim 1 wherein
    (a) the matrix material comprises epoxy resin precursors which will undergo reaction together when exposed to a catalyst to form an epoxy resin; and
    (b) the catalytic moiety is a catalyst for said reaction.

17. A composition according to claim 16 wherein the crystalline polymer in the polymeric moiety comprises a side chain crystalline polymer.

18. A composition according to claim 1 wherein
    (a) the matrix material will undergo chemical reaction when exposed to an azo initiator; and
    (b) the catalytic moiety contains an azo group.

19. A composition according to claim 18 wherein the crystalline polymer in the polymeric moiety comprises a side chain crystalline polymer.

20. A composition according to claim 1 wherein
    (a) the matrix material will undergo chemical reaction when exposed to a peroxy initiator; and
    (b) the catalytic moiety contains a peroxy group.

21. A composition according to claim 20 wherein the crystalline polymer in the polymeric moiety comprises a side chain crystalline polymer.

22. A composition which comprises
    (1) a matrix material; and
    (2) a modifying agent which
        (a) comprises
            (i) a polymeric moiety which comprises a crystalline polymeric moiety having an onset of melting temperature $T_o$ and a peak melting temperature $T_p$ such that $T_p-T_o$ is less than $T_p^{0.7}$; and
            (ii) a catalytic moiety which is bonded to the polymeric moiety through a bond having a strength of at least 10 Kcal/mole, and which, when in contact with the matrix material at an elevated temperature, catalyzes a chemical reaction of the matrix material, and
        (b) is in the form of solid particles which
            (i) are distributed in the matrix material,
            (ii) have an average particle size of less than 150 micron, and
            (iii) when heated above $T_p$, undergo a physical change which
                (A) substantially increases the extent to which the matrix material is contacted by the catalytic moiety and
                (B) causes the chemical reaction of the matrix material to take place.

23. A composition according to claim 22 wherein the modifying agent is in the form of particles having an average particle size of 0.1 to 50 micron.

24. A composition according to claim 22 wherein the polymeric moiety comprises a side chain crystalline polymeric moiety.

25. A composition according to claim 24 wherein the side chain crystalline polymeric moiety comprises units derived from one or more monomers comprising an n-alkyl group containing 12 to 50 carbon atoms.

26. A composition according to claim 46 wherein said units are derived from an n-alkyl acrylate, n-alkyl methacrylate, n-alkyl acrylamide or n-alkyl methacrylamide.

27. A composition according to claim 24 wherein the modifying agent is present in the form of solid particles which have an average diameter of 0.1 to 25 microns.

28. A composition according to claim 24 wherein the side chain crystalline polymeric moiety has a crystalline melting point of 50 to 100° C.

29. A composition according to claim 24 wherein the modifying agent has a number average molecular weight of 1.000 to 50,000.

30. A composition according to claim 22 wherein the solid particles have some of the active chemical moieties on the surface of the particles and the other active chemical moieties hidden within the particles.

31. A composition according to claim 22 wherein the matrix material is liquid, and which (i) can be stored at 40° C. for 6 months without doubling in viscosity and (ii), when heated to a temperature substantially over $T_p$, will cure in less than 1 hour to a composition which will not flow.

32. A composition according to claim 22 wherein $T_p-T_o$ is less than 10° C.

33. A composition according to claim 22 wherein the catalytic moiety comprises a metal.

34. A composition according to claim 33 wherein the catalytic moiety comprises tin.

35. A composition according to claim 33 wherein the catalytic moiety comprises a transition metal.

36. A composition according to claim 33 wherein the catalytic moiety comprises a main group metal selected from the group consisting of aluminum, tin and lead.

37. A composition according to claim 22 wherein the catalytic moiety comprises an amine group.

38. A composition according to claim 22 wherein the catalytic moiety comprises an enzyme.

39. A composition according to claim 22 wherein the catalytic moiety comprises a carboxyl or sulfonate group.

40. A composition according to claim 22, wherein the crystalline polymeric moiety has a heat of fusion, as measured by a differential scanning calorimeter (DSC), of at least 20 J/g.

41. A composition according to claim 22, wherein the particles of the modifying agent have an average particle size of 0.1 to 150 microns.

42. A composition according to claim 33, wherein the crystalline polymeric moiety has a heat of fusion, as measured by a differential scanning calorimeter (DSC), of at least 20 J/g.

43. A composition according to claim 22, wherein the matrix material provides a continuous liquid phase.

44. A composition according to claim 22, wherein the matrix material provides a continuous solid phase.

45. A composition according to claim 22, wherein the matrix material is in the form of particles which are blended with the particles of modifying agent.

46. A composition which comprises
(1) a matrix material which comprises precursors for a crosslinked thermoset epoxy resin; and
(2) a modifying agent which
  (a) comprises
    (i) a polymeric moiety which has a heat of fusion, as measured by a differential scanning calorimeter (DSC), of at least 20 J/g and which comprises a side chain crystalline polymeric moiety having an onset of melting temperature $T_o$ and a peak melting temperature $T_p$ such that $T_p-T_o$ is less than $T_p^{0.7}$ and less than 10° C.; and
    (ii) a catalytic moiety which is bonded to the polymeric moiety through a bond having a strength of at least 10 Kcal/mole, and which, when in contact with the matrix material at an elevated temperature, catalyzes chemical reaction of the matrix material to form the thermoset epoxy resin, and
  (b) is in the form of solid particles which
    (i) are distributed in the matrix material,
    (ii) have an average particle size of less than 150 microns, and
    (iii) when heated above $T_p$, undergo a physical change which
      (A) substantially increases the extent to which the matrix material is contacted by the catalytic moiety and
      (B) causes the chemical reaction of the matrix material to form the thermoset epoxy resin.

47. A composition according to claim 46 wherein the modifying agent is in the form of particles having an average particle size of 0.1 to 50 microns.

48. A composition according to claim 46 wherein the side chain crystalline polymeric moiety comprises units derived from one or more monomers comprising an n-alkyl group containing 12 to 50 carbon atoms.

49. A composition according to claim 46 wherein said units are derived from an n-alkyl acrylate, n-alkyl methacrylate, n-alkyl acrylamide or n-alkyl methacrylamide.

50. A composition according to claim 46 wherein the polymeric moiety comprises a thermoplastic elastomer.

51. A composition according to claim 46 wherein the modifying agent is present in the form of solid particles which have an average diameter of 0.1 to 25 microns.

52. A composition according to claim 46 wherein the side chain crystalline polymeric moiety has a crystalline melting point of 50 to 100° C.

53. A composition according to claim 46 wherein the modifying agent has a number average molecular weight of 1,000 to 50,000.

54. A composition according to claim 46 wherein the matrix material is liquid, and which (i) can be stored at 40° C. for 6 months without doubling in viscosity and (ii), when heated to a temperature substantially over $T_p$, will cure in less than 1 hour to a composition which will not flow.

55. A composition according to claim 46 wherein $T_p-T_o$ is less than 10° C.

56. A composition according to claim 46 wherein the catalytic moiety comprises a metal or a metal-containing group.

57. A composition according to claim 56 wherein the catalytic moiety comprises a transition metal.

58. A composition according to claim 46 wherein the catalytic moiety comprises an imidazole.

59. A composition according to claim 46 wherein the catalytic moiety comprises an amine group.

60. A composition according to claim 46 wherein the catalytic moiety comprises a carboxyl or sulfonate group.

61. A composition according to claim 46, wherein the particles of the modifying agent have an average particle size of 0.1 to 150 microns.

62. A composition according to claim 46, wherein the matrix material provides a continuous liquid phase.

63. A composition according to claim 46, wherein the matrix material provides a continuous solid phase.

64. A composition according to claim 46, wherein the matrix material is in the form of particles which are blended with the particles of modifying agent.

65. A composition which comprises
(1) a matrix material which comprises precursors for a crosslinked thermoset polyurethane resin; and
(2) a modifying agent which
  (a) comprises
    (i) a polymeric moiety which has a heat of fusion, as measured by a differential scanning calorimeter (DSC), of at least 20 J/g and which comprises a side chain crystalline polymeric moiety having an onset of melting temperature $T_o$ and a peak melting temperature $T_p$ such that $T_p-T_o$ is less than $T_p^{0.7}$ and less than 10° C.; and
    (ii) a catalytic moiety which is bonded to the polymeric moiety through a bond having a strength of at least 10 Kcal/mole, and which, when in contact with the matrix material at an elevated temperature, catalyzes a chemical reaction of the matrix material to form the thermoset polyurethane resin, and
  (b) is in the form of solid particles which (i) are distributed in the matrix material,
(ii) have an average particle size of less than 150 micron, and
(iii) when heated above $T_p$, undergo a physical change which
  (A) substantially increases the extent to which the matrix material is contacted by the catalytic moiety and
  (Bi) causes the chemical reaction of the matrix material to form the thermoset polyurethane resin.

66. A composition according to claim 65 wherein the modifying agent is in the form of particles having an average particle size of 0.1 to 50 microns.

67. A composition according to claim 65 wherein the side chain crystalline polymeric moiety comprises units derived from one or more monomers comprising an n-alkyl group containing 12 to 50 carbon atoms.

68. A composition according to claim 65 wherein said units are derived from an n-alkyl acrylate, n-alkyl methacrylate, n-alkyl acrylamide or n-alkyl methacrylamide.

69. A composition according to claim 65 wherein the polymeric moiety comprises a thermoplastic elastomer.

70. A composition according to claim 65 wherein the modifying agent is present in the form of solid particles which have an average diameter of 0.1 to 25 microns.

71. A composition according to claim 65 wherein the side chain crystalline polymeric moiety has a crystalline melting point of 50 to 100° C.

72. A composition according to claim 65 wherein the modifying agent has a number average molecular weight of 1,000 to 50,000.

73. A composition according to claim 65 wherein the matrix material is liquid, and which (i) can be stored at 40° C. for 6 months without doubling in viscosity and (ii), when heated to a temperature substantially over $T_p$, will cure in less than 1 hour to a composition which will not flow.

74. A composition according to claim 65 wherein $T_p-T_o$ is less than 10° C.

75. A composition according to claim 65 wherein the catalytic moiety comprises a metal or a metal-containing group.

76. A composition according to claim 75 wherein the catalytic moiety comprises tin.

77. A composition according to claim 75 wherein the catalytic moiety comprises a transition metal.

78. A composition according to claim 75 wherein the catalytic moiety comprises a main group metal selected from aluminum, tin and lead.

79. A composition according to claim 65 which forms a foamed thermoset resin when it is heated.

80. A composition according to claim 65, wherein the particles of the modifying agent have an average particle size of 0.1 to 150 microns.

81. A composition according to claim 65, wherein the matrix material provides a continuous liquid phase.

82. A composition according to claim 65, wherein the matrix material provides a continuous solid phase.

83. A composition according to claim 65, wherein the matrix material is in the form of particles which are blended with the particles of modifying agent.

84. A composition which comprises
(1) a matrix material which comprises precursors for a crosslinked thermoset resin; and
(2) a modifying agent which
  (a) comprises
    (i) a polymeric moiety which has a heat of fusion, as measured by a differential scanning calorimeter (DSC), of at least 20 J/g and which comprises a side chain crystalline polymeric moiety having an onset of melting temperature $T_o$ and a peak melting temperature $T_p$ which is no more than 85° C. and such that $T_p-T_o$ is less than $T_p^{0.7}$; and
    (ii) a catalytic moiety which contains an amine group, which is bonded to the polymeric moiety through a covalent bond having a strength of at least 10 Kcal/mole, and which, when in contact with the matrix material at an elevated temperature, catalyzes a chemical reaction of the matrix material to form the thermoset resin, and
  (b) is in the form of solid particles which
    (i) are distributed in the matrix material,
    (ii) have an average particle size of 0.1 to 50 micron, and
    (iii) when heated above $T_p$, undergo a physical change which
      (A) substantially increases the extent to which the matrix material is contacted by the catalytic moiety and
      (B) causes the chemical reaction of the matrix material to form the thermoset resin.

85. A composition according to claim 84, wherein the side chain crystalline polymeric moiety comprises 40 to 100% of units derived from an alkyl acrylate in which the alkyl group contains 12 to 50 carbon atoms, 0 to 20% of units derived from an alkyl acrylate in which the alkyl group contains 4 to 12 carbon atoms, and 0 to 15% of units derived from at least one polar group selected from group consisting of acrylic acid, methacrylic acid, itaconic acid, acrylamide, methacrylamide, acrylonitrile, methacrylonitrile, vinyl acetate and N-vinyl pyrrolidone.

86. A composition according to claim 84, wherein the side chain crystalline polymeric moiety consists essentially of 40 to 100% of units derived from the alkyl acrylate in which the alkyl group contains 22 carbon atoms and 0 to 15% of units derived from acrylic acid.

87. A composition which comprises
(1) a matrix material; and
(2) a modifying agent which
  (a) comprises
    (i) a polymeric ingredient which comprises a crystalline polymeric moiety having an onset of melting temperature $T_o$ and a peak melting temperature $T_p$ such that $T_p-T_o$ is less than $T_p^{0.7}$, and
    (ii) a catalytic ingredient which is physically but not chemically bound to the polymeric ingredient, and which, when in contact with the matrix material at an elevated temperature, catalyzes a chemical reaction of the matrix material, and
  (b) is in the form of solid particles which
    (i) have some of the active chemical moieties on the surface of the particles and the other active chemical moieties hidden within the particles
    (ii) are distributed in the matrix material,
    (iii) have an average particle size of less than the 150 micron, and
    (iv) when heated above $T_p$, undergo a physical change which
      (A) substantially increases the extent to which the matrix material is contacted by the catalytic ingredient, and
      (b) causes the chemical reaction of the matrix material to take place.

88. A composition according to claim 87 which also contains a coadditive which contains (i) one or more nonpolar groups which are alkyl, fluoroalkyl, or alkyl styrene groups in which the alkyl groups contain at least 6 carbon atoms, and (ii) one or more polar groups which are epoxy, hydroxyl, carboxyl, amino, ammonium, ether, ester, amide, sulfonamide, sulfonic acid, sulfonic acid salt or phosphate groups.

89. A composition according to claim 87 wherein the modifying agent contains polar groups and the matrix material contains polar groups.

90. A composition according to claim 87 wherein the modifying agent is in the form of solid particles which are dispersed in a continuous solid or liquid phase of the matrix material.

91. A composition according to claim 90 wherein
  (a) the matrix material comprises an unsaturated polyester which will undergo a crosslinking reaction when exposed to a metal-containing catalyst; and
  (c) the catalytic ingredient is a metal-containing compound which is a catalyst for said crosslinking reaction.

92. A composition according to claim 91 wherein the polymeric ingredient is a side chain crystalline polymer, and both the side chain crystalline polymer and the metal-containing compound contain a group selected from polar groups and long chain alkyl groups.

93. A composition according to claim 90 wherein
  (a) the matrix material comprises a vinyl ester which will undergo a crosslinking reaction when exposed to a metal-containing catalyst; and
  (b) the catalytic ingredient is a metal-containing compound which is a catalyst for said crosslinking reaction.

94. A composition according to claim 93 wherein the polymeric ingredient is a side chain crystalline polymer.

95. A composition according to claim 90 wherein
  (a) the matrix material comprises chemical compounds which will undergo reaction together to form a polyurethane, and
  (b) the catalytic ingredient is a metal-containing compound which is a catalyst for said reaction.

96. A composition according to claim 95 wherein the polymeric ingredient is a side chain crystalline polymer.

97. A composition according to claim 96 which forms a foamed product when subjected to a reaction injection molding process.

98. A composition according to claim 90 wherein
  (a) the matrix material comprises chemical compounds which will undergo reaction together to form a polyurea, and
  (b) the catalytic ingredient is a metal-containing compound which is a catalyst for said reaction.

99. A composition according to claim 98 wherein the polymeric ingredient is a side chain crystalline polymer.

100. A composition according to claim 90 wherein
  (a) the matrix material comprises chemical compounds which will undergo reaction together to form a polyisocyanurate, and
  (b) the catalytic ingredient is a metal-containing compound which is a catalyst for said reaction.

101. A composition according to claim 100 wherein the polymeric ingredient is a side chain crystalline polymer.

102. A composition according to claim 1 which is suitable for use in the preparation of a powder coating and which comprises
  (1) a matrix material which comprises precursors for a thermoset polymer; and
  (2) a modifying agent which
    (a) comprises
      (i) a polymeric moiety which comprises a crystalline polymeric moiety having an onset of melting temperature $T_o$ and a peak melting temperature $T_p$ such that $T_p - T_o$ is less than $T_p^{0.7}$; and
      (ii) a catalytic moiety which, when in contact with the matrix material at an elevated temperature, catalyzes a chemical reaction which converts the matrix material into a thermoset polymer, and
    (b) is in the form of solid particles which
      (i) are distributed in the matrix material,
      (ii) have an average particle size of less than 150 micron, and
      (iii) when heated above $T_p$, undergo a physical change which (A) substantially increases the extent to which the matrix material is contacted by the catalytic moiety, and (B) causes the chemical reaction of the matrix material to take place.

103. A composition according to claim 102 wherein the crystalline polymer in the polymeric moiety comprises a side chain crystalline polymer.

104. A composition according to claim 103 wherein the matrix material comprises an unsaturated polyester, and the catalytic moiety is a metal-containing compound.

105. A composition according to claim 104 wherein the matrix material comprises a vinyl ester.

106. A composition according to claim 103 wherein the matrix material comprises precursors for a polyurethane.

107. A composition according to claim 103 wherein the matrix material comprises precursors for an epoxy resin.

* * * * *